(12) United States Patent
Qiaoming et al.

(10) Patent No.: US 12,159,868 B2
(45) Date of Patent: Dec. 3, 2024

(54) SEMICONDUCTOR STRUCTURE AND METHOD FOR FORMING SAME

(71) Applicant: Semiconductor Manufacturing North China (Beijing) Corporation, Beijing (CN)

(72) Inventors: Cai Qiaoming, Beijing (CN); Ma Lisha, Beijing (CN)

(73) Assignee: Semiconductor Manufacturing North China (Beijing) Corporation, Beijing (CN)

( * ) Notice: Subject to any disclaimer, the term of this patent is extended or adjusted under 35 U.S.C. 154(b) by 448 days.

(21) Appl. No.: 17/691,297

(22) Filed: Mar. 10, 2022

(65) Prior Publication Data
US 2022/0293593 A1    Sep. 15, 2022

(30) Foreign Application Priority Data
Mar. 12, 2021   (CN) .......................... 202110269371.X

(51) Int. Cl.
H01L 27/088   (2006.01)
H01L 21/285   (2006.01)
(Continued)

(52) U.S. Cl.
CPC ...... *H01L 27/088* (2013.01); *H01L 21/28518* (2013.01); *H01L 21/823418* (2013.01);
(Continued)

(58) Field of Classification Search
None
See application file for complete search history.

(56) References Cited

U.S. PATENT DOCUMENTS

| 5,341,003 A * | 8/1994 | Obinata | H01L 29/7395 257/E29.066 |
|---|---|---|---|
| 2022/0037550 A1* | 2/2022 | Liang | H01L 31/022408 |

FOREIGN PATENT DOCUMENTS

| CN | 87102223 A | * | 9/1987 | ....... H01L 27/14887 |
|---|---|---|---|---|
| JP | 2003204057 A | * | 7/2003 | |

* cited by examiner

*Primary Examiner* — Michael Lebentritt
(74) *Attorney, Agent, or Firm* — Crowell & Moring LLP

(57) ABSTRACT

Semiconductor structures and methods for forming same are disclosed. In one form, a structure includes: a base, including a first device region and a second device region, where the first device region includes a channel region, and preset regions located on two sides of the channel region, and a well pick-up region surrounding the channel region and the preset regions; a first isolation structure, located in the base between the preset regions and the well pick-up region and between the well pick-up region and the adjacent second device region; a poly gate, covering the channel region; a first source/drain doping region, located in the preset regions on two sides of the poly gate; a metal gate, located on the base in the second device region; a support structure, located on the top of the first isolation structure; and an interlayer dielectric layer, covering side walls of the poly gate, the metal gate, and the support structure. The support structure can mitigate a problem of top surface dishing of the interlayer dielectric layer above the first isolation structure, to avoid contacting the first source/drain doping region and the well pick-up region in a planarization process of forming the interlayer dielectric layer and the metal gate, thereby improving the performance of the semiconductor structure.

20 Claims, 8 Drawing Sheets

(51) Int. Cl.
*H01L 21/8234* (2006.01)
*H01L 29/45* (2006.01)
*H01L 29/66* (2006.01)

(52) U.S. Cl.
CPC ...... *H01L 21/823481* (2013.01); *H01L 29/45* (2013.01); *H01L 29/665* (2013.01); *H01L 29/66545* (2013.01)

SEMICONDUCTOR STRUCTURE AND METHOD FOR FORMING SAME

RELATED APPLICATIONS

The present application claims priority to Chinese Patent Appln. No. 202110269371.X, filed Mar. 12, 2021, the entire disclosure of which is hereby incorporated by reference.

BACKGROUND

Technical Field

Embodiments of the present disclosure relate to the field of semiconductor manufacturing, and in particular, to a semiconductor structure and a method for forming same.

Related Art

In semiconductor technologies, even as the size of elements continue to decrease, it is still expected that a performance of transistors can be further enhanced, and it is also expected that an integrated circuit (IC) semiconductor apparatus that combines low voltage (LV), medium voltage (MV), high voltage (HV) application ranges can be manufactured.

For example, an IC used for driving an image sensor, a liquid crystal display (LCD), or a magnetic printing head (referred to as a driver IC hereinafter) is formed by a driver output unit having an HV metal-oxide semiconductor (MOS) transistor that operates at a power supply voltage above 3.3 V and has HV endurance between a drain and a source and a logical unit that controls the driver output unit and has an LV MOS transistor that may be used at a power supply voltage below several volts and have LV endurance at a drain. This type of IC is usually referred to as a system on a chip. This type of IC includes a logical transistor that uses an ultralow voltage (for example, 1.8 V or 2.5 V) for operation. However, other transistors located on the same IC are designed for HV applications and are therefore operate at an HV. In addition, a voltage difference between a drain and a source may usually be up to 30 V or even 40 V. An HV transistor element is capable of loading a higher current than the logical transistor in a logical circuit or a surrounding transistor.

Compared with an LV device, an HV device and an MV device have relatively high operating voltages. The HV device and the MV device correspondingly have relatively large sizes. A poly gate is still used in the HV device and the MV device, and a metal gate is used in the LV device.

However, at present, formed devices have inadequate performance.

SUMMARY

A problem to be addressed in the embodiments and implementations of the present disclosure is to provide a semiconductor structure and a method for forming same, which is conducive to mitigating a problem of top surface dishing of an interlayer dielectric layer above a first isolation structure, to avoid contacting top surfaces of a first source/drain doping region and a well pick-up region in a planarization process of forming the interlayer dielectric layer and a metal gate, thereby improving the performance of the semiconductor structure.

To address the foregoing problem, one form of the present disclosure provides a semiconductor structure, including: a base, including a first device region configured to form a first device and a second device region configured to form a second device, where a channel length of the first device is greater than a channel length of the second device, and the base in the first device region includes a channel region, preset regions located on two sides of the channel region in a length direction of the channel region, and a well pick-up region surrounding the channel region and the preset regions; a first isolation structure, located in the base between the preset regions and the well pick-up region and between the well pick-up region and the adjacent second device region; a poly gate, covering the base of the channel region; a first source/drain doping region, located in the base in the preset regions on two sides of the poly gate; a metal gate, located on the base in the second device region; a second source/drain doping region, located in the base on two sides of the metal gate; a support structure, located on the top of the first isolation structure; and an interlayer dielectric layer, located on the base, and covering side walls of the poly gate, the metal gate, and the support structure.

In another form, the present disclosure provides a method for forming a semiconductor structure, including: providing a base, including a first device region used for forming a first device and a second device region used for forming a second device, where a channel length of the first device is greater than a channel length of the second device, where the base in the first device region includes a channel region, preset regions located on two sides of the channel region in a length direction of the channel region and used for forming a first source/drain doping region, and a well pick-up region surrounding the channel region and the preset regions, a first isolation structure formed in the base between the preset regions and the well pick-up region and between the well pick-up region and the adjacent second device region, discrete poly gates formed on the base in the first device region and the second device region, and the poly gate located in the first device region covers the channel region; forming a first source/drain doping region in the preset regions on two sides of the poly gate in the first device region; forming a second source/drain doping region in the base on two sides of the poly gate in the second device region; forming a support structure on the first isolation structure exposed from the poly gate; forming an interlayer dielectric layer on the base after the first source/drain doping region, the second source/drain doping region, and the support structure are formed, where the interlayer dielectric layer covers side walls of the poly gate and the support structure, and exposes the top of the poly gate in the second device region; removing the poly gate in the second device region, and forming a gate opening in the interlayer dielectric layer; and forming a metal gate in the gate opening.

Compared with the prior art, technical solutions in embodiments and implementations of the present disclosure have at least the following advantages:

Semiconductor structures provided in embodiments and implementations of the present disclosure further includes a support structure, located on the top of the first isolation structure; and the forming the interlayer dielectric layer includes a process of planarizing a dielectric material layer, the forming the metal gate includes a process of planarizing a metal gate material, and the support structure can achieve a supporting effect in a planarization process of forming the interlayer dielectric layer and the metal gate, to avoid over-polishing the interlayer dielectric layer above the first isolation structure, which is conducive to mitigating problems of top surface dishing and a reduced thickness of the interlayer dielectric layer above the first isolation structure.

In addition, the support structure can further protect the first source/drain doping region and the well pick-up region, which is conducive to avoiding contacting top surfaces of the first source/drain doping region and the well pick-up region during planarization. The top surfaces of the first source/drain doping region and the well pick-up region are usually further formed with a metal silicide layer, which is correspondingly conducive to avoiding contacting the metal silicide layer located on the top surfaces of the first source/drain doping region and the well pick-up region during planarization, thereby improving the performance of the semiconductor structure.

In forms of a method for forming a semiconductor structure in embodiments and implementations of the present disclosure, before the interlayer dielectric layer is formed, the support structure is further formed on the first isolation structure exposed from the poly gate; and the forming the interlayer dielectric layer includes a process of planarizing a dielectric material layer, the forming the metal gate includes a process of planarizing a metal gate material, and the support structure can achieve a supporting effect in the planarization process of forming the interlayer dielectric layer and the metal gate, to avoid over-polishing the interlayer dielectric layer above the first isolation structure, which is conducive to mitigating problems of top surface dishing and a reduced thickness of the interlayer dielectric layer above the first isolation structure. In addition, because the support structure that can achieve a supporting effect is provided on the base around the first source/drain doping region and the well pick-up region, the support structure can further protect the first source/drain doping region and the well pick-up region, which is conducive to avoiding contacting top surfaces of the first source/drain doping region and the well pick-up region during planarization. The top surfaces of the first source/drain doping region and the well pick-up region are usually further formed with a metal silicide layer, which is correspondingly conducive to avoiding contacting the metal silicide layer located on the top surfaces of the first source/drain doping region and the well pick-up region during planarization, and is further conducive to avoiding causing metal contamination on a planarization machine. In summary, embodiments and implementations of the present disclosure are conducive to improving the performance of a semiconductor structure and the yield of production and manufacturing.

DETAILED DESCRIPTION

As can be seen from the prior art, at present, the performance of semiconductor structures need to be improved. Reasons why the performance of semiconductor structures need to be improved are now analyzed in combination with a method for forming a semiconductor structure. FIG. 1 to FIG. 5 are schematic structural diagrams corresponding to steps in a method for forming a semiconductor structure.

Figure 1:
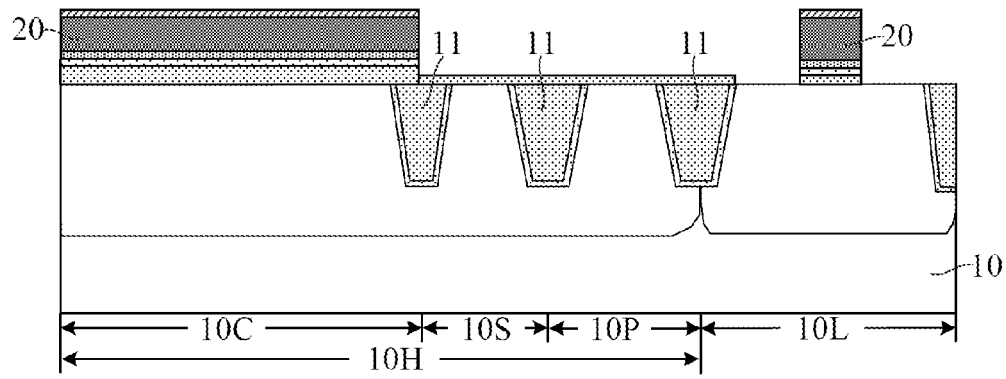
FIG. 1 to FIG. 5 are schematic structural diagrams corresponding to steps in a method for forming a semiconductor structure.

Referring to FIG. 1, a base 10 is provided, including a first device region 10H used for forming a first device and a second device region 10L used for forming a second device. A channel length of the first device is greater than a channel length of the second device. The base 10 in the first device region 10H includes a channel region 10C, preset regions 10S located on two sides of the channel region 10C in a length direction of the channel region 10C and used for forming a first source/drain doping region, and a well pick-up region 10P surrounding the channel region 10C and the preset regions 10S. An isolation structure 11 is formed in the base 10 between the channel region 10C and the preset regions 10S, between the preset regions 10S and the well pick-up region 10P, between the channel region 10C and the well pick-up region 10P, and between the well pick-up region 10P and the adjacent second device region 10L.

Continuing to refer to FIG. 1, discrete poly gates 20 are formed in the base 10 in the first device region 10H and the second device region 10L. The poly gate 20 in the first device region 10H covers the base 10 of the channel region 10C.

Figure 2:
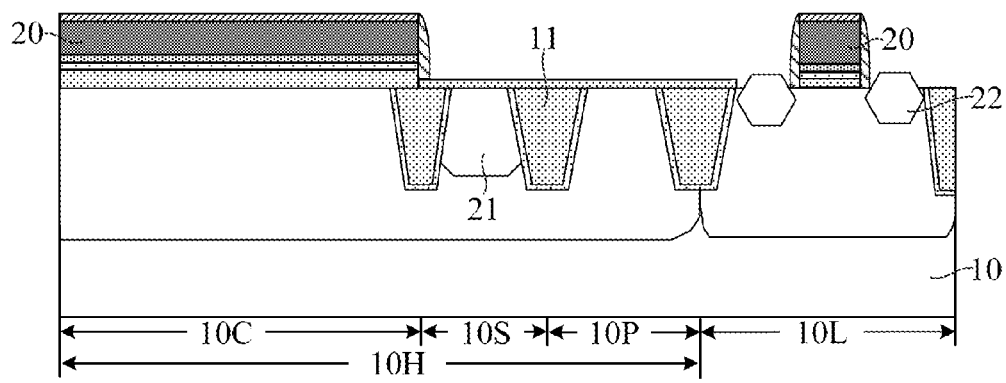

Referring to FIG. 2, a first source/drain doping region 21 is formed in the preset regions 10S on two sides of the poly gate 20 in the first device region 10H; and a second source/drain doping region 22 is formed in the base 10 on two sides of the poly gate 20 in the second device region 10L.

Figure 3:
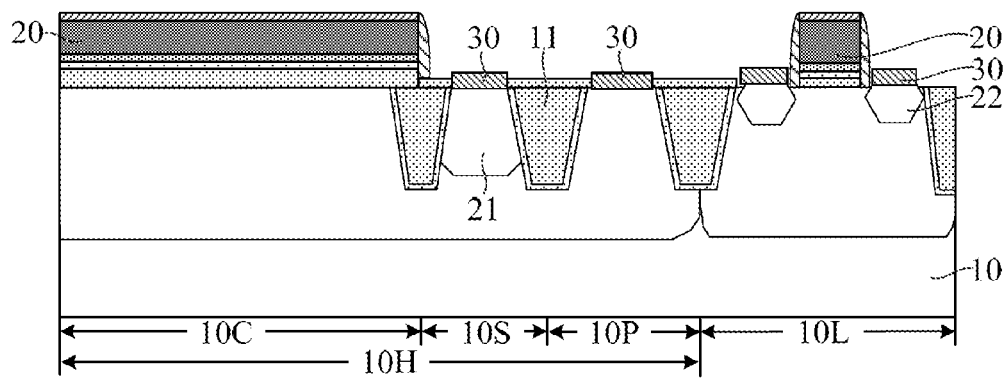

Referring to FIG. 3, a metal silicide layer 30 is formed on top surfaces of the first source/drain doping region 21, the well pick-up region 10P, and the second source/drain doping region 22.

Figure 4:
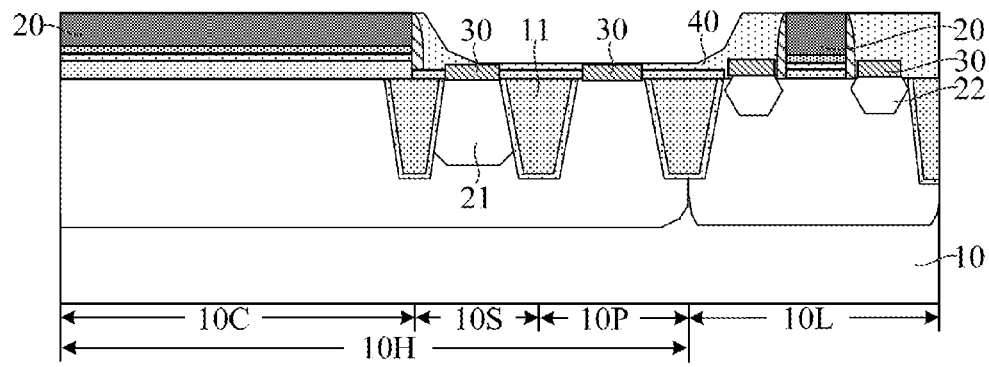

Referring to FIG. 4, an interlayer dielectric layer 40 is formed on the base 10 at the side portion of the poly gate 20, covering the metal silicide layer 30 and the isolation structure 11, and exposing the top of the poly gate 20 in the second device region 10L. The step of forming the interlayer dielectric layer 40 usually includes: forming a dielectric material layer (not shown in the figure) covering a side wall and the top of the poly gate 20 on the base 10; and planarizing the dielectric material layer, removing the dielectric material layer higher than a top surface of the poly gate 20 in the second device region 10L, and using the remaining dielectric material layer as the interlayer dielectric layer 40.

Figure 5:
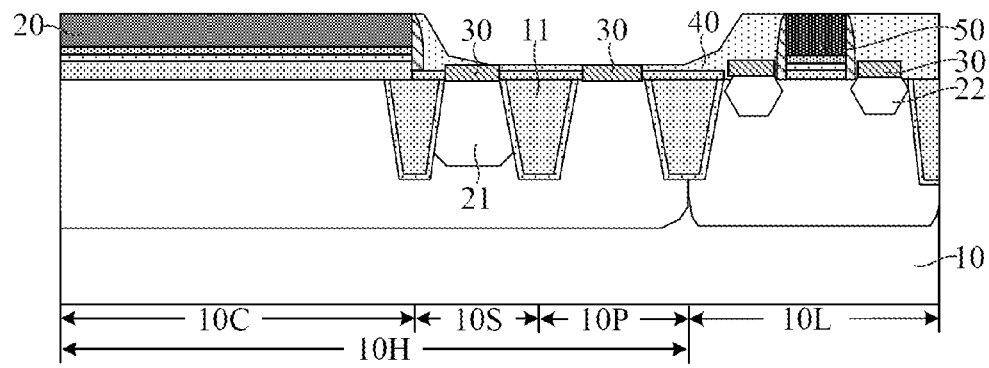

Referring to FIG. 5, the poly gate 20 in the second device region 10L is removed, and a gate opening (not shown in the figure) is formed in the interlayer dielectric layer 40 in the second device region; and a metal gate 50 is formed in the gate opening. The step of forming the metal gate 50 usually includes: filling a metal gate material (not shown in the figure) in the gate opening, where the metal gate material is further formed on the interlayer dielectric layer 40; and planarizing the metal gate material, removing the metal gate material located on a top surface of the interlayer dielectric layer 40, and using the remaining metal gate material located in the gate opening as the metal gate 50.

In the method, because the poly gate 20 is not formed on the base 10 around the first source/drain doping region 21 and the well pick-up region 10P, the poly gate 20 around the first source/drain doping region 21 and the well pick-up region 10P has low pattern density. A structure that can achieve a supporting effect is not formed around the first source/drain doping region 21 and the well pick-up region 10P. In a process of planarizing the dielectric material layer and planarizing the metal gate material, the interlayer dielectric layer 40 above the first source/drain doping region 21 and the well pick-up region 10P is prone to over-polishing, resulting in a problem of severe top surface dishing of the interlayer dielectric layer 40 above the first source/drain doping region 21 and the well pick-up region 10P, to reduce the thickness of the interlayer dielectric layer 40 above the first source/drain doping region 21 and the well pick-up region 10P, or even resulting in contact with the metal silicide layer 30 located on the top surfaces of the first source/drain doping region 21 and the well pick-up region 10P during planarization. As a result, planarization machine is prone to metal contamination, to cause inadequate performance of the formed device and reduced production yield.

In particular, the channel length of the first device is greater than the channel length of the second device, and an operating voltage of the first device is greater than an operating voltage of the second device. To better isolate the first device from the second device, the area of the isolation structure 11 located between the well pick-up region 10P and the adjacent second device region 10L is relatively large, in a planarization process of forming the interlayer dielectric layer 40 and the metal gate 50, the interlayer dielectric layer 40 above the first source/drain doping region 21 and the well pick-up region 10P has a severe over-polishing problem, and the metal silicide layer 30 located on the top surfaces of the first source/drain doping region 21 and the well pick-up region 10P is highly prone to contact during planarization.

To address the technical problem, one form of a semiconductor structure provided in embodiments and implementations of the present disclosure includes a support structure, located on the top of a first isolation structure. The support structure can achieve a supporting effect in a planarization process of forming the interlayer dielectric layer and the metal gate, to avoid over-polishing the interlayer dielectric layer above the first isolation structure, which is conducive to mitigating problems of top surface dishing and a reduced thickness of the interlayer dielectric layer above the first isolation structure. In addition, the support structure can further protect the first source/drain doping region and the well pick-up region, which is conducive to avoiding contacting top surfaces of the first source/drain doping region and the well pick-up region during planarization. The top surfaces of the first source/drain doping region and the well pick-up region are usually further formed with a metal silicide layer, which is correspondingly conducive to preventing the metal silicide layer from being planarized, thereby improving the performance of the semiconductor structure.

Figure 6:
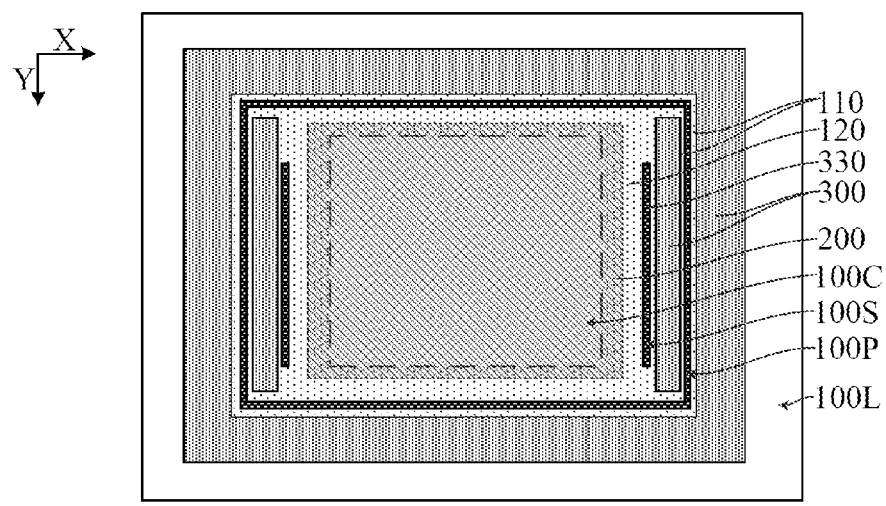
FIG. 6 and FIG. 7 are schematic structural diagrams of one form of a semiconductor structure according to the present disclosure.
Figure 7:
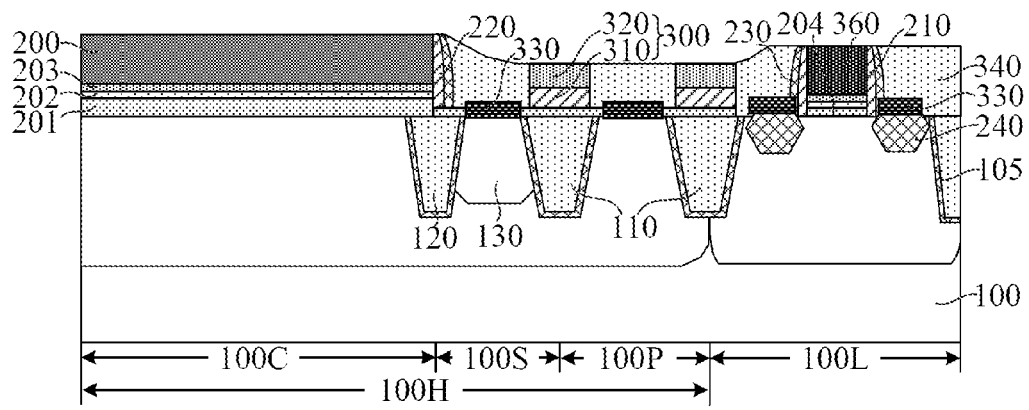

To make the foregoing objectives, features, and advantages of the embodiments of the present disclosure more apparent and comprehensible, specific embodiments and implementations of the present disclosure are described in detail below with reference to the accompanying drawings. FIG. 6 is a top view, and FIG. 7 is a partial sectional view of FIG. 6 in a length direction of a channel region, showing schematic structural diagram of one form of a semiconductor structure according to the present disclosure.

In this form, the semiconductor structure includes: a base 100, including a first device region 100H used for forming a first device and a second device region 100L used for forming a second device, where a channel length of the first device is greater than a channel length of the second device, the channel length of the first device is greater than the channel length of the second device, and the base 100 in the first device region 100H includes a channel region 100C, preset regions 100S located on two sides of the channel region 100C in a length direction (as shown by a direction X in FIG. 6) of the channel region 100C and used for forming a first source/drain doping region, and a well pick-up region 100P surrounding the channel region 100C and the preset regions 100S; a first isolation structure 110, located in the base 100 between the preset regions 100S and the well pick-up region 100P and between the well pick-up region 100P and the adjacent second device region 100L; a poly gate 200, covering the base 100 of the channel region 100C; a first source/drain doping region 130, located in the base 100 of the preset regions 100S on two sides of the poly gate 200; a metal gate 360, located on the base 100 in the second device region 100L; a second source/drain doping region 240, located in the base 100 on two sides of the metal gate 360; a support structure 300, located on the top of the first isolation structure 110; and an interlayer dielectric layer 340, located on the base 100, and covering side walls of the poly gate 200, the metal gate 360, and the support structure 300. The metal gate 360 is used as a first metal gate 360.

The base 100 is used for providing a process platform for forming the semiconductor structure.

In this form, the forming a planar field effect transistor is used as an example. The base 100 is a planar base. In this form, the base 100 is a silicon substrate. In other forms, the material of the base may be alternatively germanium, silicon-germanium, silicon carbide, gallium arsenide or indium gallium, among other materials.

In some other forms, according to the type of the actually formed transistor, the base may be alternatively a three-dimensional base.

The channel length of the first device is greater than the channel length of the second device, and an operating voltage of the first device is higher than an operating voltage of the second device.

In this form, the first device includes one or two of an MV device and an HV device, and the second device is an LV device. The operating voltages of the LV device, the MV device, and the HV device sequentially increase. In an example, the operating voltage of the LV device is less than 1.5 V, the operating voltage of the MV device is 1 V to 10 V, and the operating voltage of the HV device is greater than 10 V.

In this form, an example in which the first device is an HV device and the second device is an LV device is used for description. Specifically, the second device is a core device.

It needs to be noted that the first device may be an N-channel MOS (NMOS) transistor or a P-channel MOS (PMOS) transistor. Similarly, the second device may also be an NMOS transistor or a PMOS transistor. In an example, the first device is an NMOS transistor, and the second device is a PMOS transistor.

In this form, a well region (not shown) is formed in the base 100. Channels of the well region and the transistor have different conductivity types. To form an NMOS transistor, the well region is doped with P-type ions. To form a PMOS transistor, the well region is doped with N-type ions.

In an example, the first device is an NMOS transistor. The well region in the first device region 100H is a P-type doped deep well region (Pwell). Specifically, the well region in the first device region 100H is a P-type doped deep well region of an HV device (HV Pwell), to enable the first device to bear a relatively large operating voltage.

In an example, the second device is a PMOS transistor, and the well region in the second device region 100L is an N-type doped well region.

The base 100 in the first device region 100H includes a channel region 100C. When the first device operates, a conductive channel is formed in the base 100 of the channel region 100C. Specifically, the channel region 100C is located in the well region.

In this form, the length direction of the channel region 100C is a movement direction of carriers in the conductive channel when the device operates. Specifically, the first source/drain doping region 130 includes a source region and a drain region that are respectively located on the two sides of the poly gate 200. A direction from the drain region to the source region is the length direction of the channel region 100C. In this form, the length direction of the channel region 100C is shown by the direction X in FIG. 6, and a direction perpendicular to the length direction of the channel region 100C is a width direction of the channel region 100C (shown by a direction Y in FIG. 6).

The preset regions 100S are used for forming the first source/drain doping region 130. The preset regions 100S are located on the two sides of the channel region 100C in the length direction of the channel region 100C. The preset regions 100S are long strip structures extending in the width direction of the channel region 100C.

The well pick-up region 100P is used for implementing an electrical connection between the well region and an external circuit or another interconnection structure. Specifically, the semiconductor structure usually further includes a contact hole plug that is located above the well pick-up region 100P and in contact with the well pick-up region 100P, to supply a substrate potential to the base 100 through the contact hole plug.

In this form, the well pick-up region 100P is a closed annular structure, and is further used as a guard ring for isolating external coupling noise.

In this form, the base 100 further includes a third device region (not shown in the figure) used for forming a third device. Channels of the third device and the second device have different conductivity types. In this form, the third device is also an LV device, and a channel length of the third device is less than the channel length of the first device. In this form, the second device is a PMOS transistor, and the third device is correspondingly an NMOS transistor.

In this form, the base 100 further includes a functional region (not shown in the figure) used for forming a functional structure. The functional structure includes a resistor structure, a capacitor structure, a diode, a bipolar junction transistor, and the like. In an example, the functional region is used for forming the resistor structure.

The first isolation structure 110 is used for isolating the well pick-up region 100P from the first source/drain doping region 130, and is further used for isolating the well pick-up region 100P from adjacent devices. In this form, the first isolation structure 110 located on an outer side of the well pick-up region 100P surrounds the well pick-up region 100P. Correspondingly, the first isolation structure 110 located on the outer side of the well pick-up region 100P is also an annular structure.

In this form, a second isolation structure 120 is further formed in the base 100 between the channel region 100C and the preset regions 100S. The second isolation structure 120 is used for increasing a movement path between a carrier and a conductive channel, to improve the voltage endurance of the first device.

Specifically, in this form, a first trench (not shown) is formed in the base 100 between the well pick-up region 100P and the channel region 100C and between the well pick-up region 100P and the adjacent second device region 100L, a second trench (not shown) is formed in the base 100 between the channel region 100C and the preset regions 100S, the first isolation structure 110 is located in the first trench, and the second isolation structure 120 is located in the second trench.

Correspondingly, the first trench and the second trench are used for defining an active area (AA) in the base 100 in the first device region 100H. That is, the base 100 in the first device region 100H isolated by the first trench and the second trench is an AA.

Specifically, in this form, the channel region 100C, the preset regions 100S, and the well pick-up region 100P isolated by the first isolation structure 110 and the second isolation structure 120 are AAs.

In this form, the first isolation structure 110 and the second isolation structure 120 are both shallow trench isolation (STI) structures. The material of the first isolation structure 110 and the second isolation structure 120 is an insulating material, for example, silicon oxide, silicon nitride, or silicon oxynitride.

The semiconductor structure further includes: a lining layer 105, located between the first isolation structure 110 and a side wall and the bottom of the first trench, and located between the second isolation structure 120 and a side wall and the bottom of the second trench.

The lining layer 105 is used for improving the interface quality of bottom surfaces and the side walls of the first trench and the second trench, to further improve the forming quality of the first isolation structure 110 and the second isolation structure 120. In an example, the material of the lining layer 105 is silicon oxide.

The poly gate 200 is used as a device gate structure of the first device, to control the opening or closing of a conductive channel of the first device.

The first device region 100H is used for forming the first device, the channel length of the first device is greater than the channel length of the second device, and a gate of the first device correspondingly has a relatively large size. Therefore, the poly gate 200 is used in the first device, to avoid using the metal gate in the first device, which is conducive to avoiding a problem of top surface dishing of the metal gate caused by the relatively large gate in the first device region 100H.

In this form, the material of the poly gate 200 is polysilicon.

In this form, the poly gate 200 covers the base 100 of the channel region 100C, and further extends to cover a part of the second isolation structure 120.

The first source/drain doping region 130 is used as a source region or a drain region of the first device.

In this form, the first device is an NMOS transistor, and the first source/drain doping region 130 is N-type doped. In other forms, to form a PMOS transistor, the first source/drain doping region is P-type doped.

The first metal gate 360 is used for controlling the opening and closing of the conductive channel of the second device.

The material of the metal gate 360 is Al, Cu, Ag, Au, Pt, Ni, Ti, or W. In this form, the material of the metal gate 360 is Al.

The second source/drain doping region 240 is used as a source region or a drain region of the second device. In this form, the second source/drain doping region 240 includes a source/drain epitaxial layer doped with ions, to provide the channel with stress, thereby improving carrier mobility.

In this form, the second device is a PMOS transistor, the second source/drain doping region 240 is P-type doped, the second source/drain doping region 240 is doped with P-type ions, and the material of the source/drain epitaxial layer is SiGe, to provide a channel region of the PMOS transistor with a tensile stress function, thereby improving the carrier mobility of a channel in the PMOS transistor.

In this form, the base 100 further includes a third device region; and the semiconductor structure further includes: a second metal gate (not shown in the figure), located on the base 100 in the third device region; and a third source/drain doping region (not shown in the figure), located in the base 100 on two sides of the second metal gate.

The third source/drain doping region is used as a source region or a drain region of the third device. In this form, channels of the third device and the second device have different conductivity types. Correspondingly, the third source/drain doping region and the second source/drain doping region have different doping types. In this form, the third device is an NMOS transistor, and the third source/drain doping region is correspondingly N-type doped.

In this form, the semiconductor structure further includes: a laminate structure (not shown), located between the poly gate 200 and the base 100 and between the first metal gate 360 and the base 100.

In this form, the laminate structure includes a high-k gate dielectric layer 202 and a cap layer 203 sequentially stacked from bottom to top.

In this form, the material of the high-k gate dielectric layer 202 is a high-k dielectric material. In an example, the material of the high-k gate dielectric layer 202 is $HfO_2$.

In this form, the cap layer 203 is used for isolating the high-k gate dielectric layer 202 from the poly gate 200 and isolating the high-k gate dielectric layer 202 from the metal gate 360, to protect the high-k gate dielectric layer 202. In addition, the cap layer 203 is further used for stopping easily diffusible ions in the metal gate 360 from diffusing to the high-k gate dielectric layer 202. The cap layer 203 also has particular impact on a gate work function of the second device.

The material of the cap layer 203 includes one or two of titanium nitride (TiN) and silicon-doped titanium nitride (TiSiN). In this form, the material of the cap layer 203 is TiN.

The semiconductor structure further includes: a gate oxide layer 201, located between the laminate structure and the base 100 in the first device region 100H; and an interface buffer layer 204, located between the laminate structure and the base 100 in the second device region 100L, where the thickness of the interface buffer layer 204 is less than the thickness of the gate oxide layer 201.

The gate oxide layer 201 is used for isolating the poly gate 200 from the channel of the first device. The interface buffer layer 204 is used as an interface buffer layer between the high-k gate dielectric layer 202 and the base 100 in the second device region 100L, which is conducive to mitigating electron mobility, thereby improving interface stability and device reliability.

The material of the gate oxide layer 201 and the interface buffer layer 204 is silicon oxide or silicon oxynitride. In this form, the material of the gate oxide layer 201 and the interface buffer layer 204 is silicon oxide.

The support structure 300 can achieve a supporting effect in a planarization process of forming the interlayer dielectric layer 340 and the metal gate 360, to avoid over-polishing the interlayer dielectric layer above the first isolation structure 110, which is conducive to mitigating problems of top surface dishing and a reduced thickness of the interlayer dielectric layer 340 above the first isolation structure 110. In addition, the support structure 300 can further protect the first source/drain doping region 130 and the well pick-up region 100P, which is conducive to avoiding contacting top surfaces of the first source/drain doping region 130 and the well pick-up region 100P during planarization. The top surfaces of the first source/drain doping region 130 and the well pick-up region 100P are usually further formed with a metal silicide layer, which is correspondingly conducive to preventing the metal silicide layer from being planarized, thereby improving the performance of the semiconductor structure.

A material with relatively large hardness is chosen for the support structure 300, to ensure that the support structure 300 can achieve a supporting effect and a polishing protection effect in the planarization process of forming the interlayer dielectric layer 340 and forming the metal gate 360. In this form, the material of the support structure 300 includes one or more of silicon nitride, silicon oxynitride, silicon carbide, silicon oxycarbide, silicon oxy-carbonitride, boron nitride, and boron carbonitride.

It needs to be noted that, in this form, a top surface of the support structure 300 is level with a top surface of the metal gate 360, or a top surface of the support structure 300 is lower than a top surface of the metal gate 360.

The step of forming the interlayer dielectric layer 340 and the metal gate 360 includes: forming the interlayer dielectric layer 340 on the base 100 at the side portion of the poly gate 200, and exposing the poly gate 200 in the second device region 100L; and removing the poly gate 200 located in the second device region 100L, forming a gate opening in the interlayer dielectric layer 340, and forming the metal gate 360 in the gate opening.

The forming the interlayer dielectric layer 340 includes a process of planarizing a dielectric material layer, and the forming the metal gate 360 includes a process of planarizing a metal gate material layer. In this form, the top surface of the support structure 300 is not higher than the top surface of the metal gate 360, to avoid adverse impact on the planarization process of forming the interlayer dielectric layer 340 and forming the metal gate 360.

In this form, an example in which the top surface of the support structure 300 is lower than the top surface of the metal gate 360 is used for description.

It needs to be noted that in a surface normal direction of the base 100, a height difference between the top surface of the support structure 300 and the top surface of the metal gate 360 should not be excessively large. When the top surface of the support structure 300 is lower than the top surface of the metal gate 360, if the height difference is excessively large, the thickness of the support structure 300 is correspondingly excessively small as a result, the risk that the support structure 300 is removed in the planarization process of forming the interlayer dielectric layer 340 and forming the metal gate 360 tends to be increased, and the supporting effect of the support structure 300 tends to be inadequate. In view of this, in this form, in the surface normal direction of the base 100, the height difference between the top surface of the support structure 300 and the top surface of the metal gate 360 is less than or equal to 500 Å.

In an example, in the surface normal direction of the base 100, the height difference between the top surface of the support structure 300 and the top surface of the metal gate 360 is 100 Å to 500 Å.

It further needs to be noted that, in this form, in a width direction of the first isolation structure 110, the side wall of the support structure 300 is indented relative to a side wall of the first isolation structure 110 on the same side, and the side wall of the support structure 300 is indented relative to the side wall of the first isolation structure 110 on the same side, to reserve a process space for an overlay shift in a photolithography process for forming the support structure 300, so that the support structure 300 is prevented from being formed on the first source/drain doping region 130 and the well pick-up region 100P due to the overlay shift, and it is correspondingly ensured that in a process of performing a metal silicide process, the metal layer can contact both the top surfaces of the first source/drain doping region 130 and the well pick-up region 100P, thereby increasing a process window of the photolithography process for forming the support structure 300.

To ensure that a distance by which the side wall of the support structure 300 is indented relative to the side wall of the first isolation structure 110 on the same side can compensate for the overlay shift in the photolithography process and to ensure that the area of the support structure 300 is not excessively small to enable the support structure 300 to achieve a sufficient supporting effect, in this form, in the width direction of the first isolation structure 110, the side wall of the support structure 300 is indented relative to the side wall of the first isolation structure 110 on the same side by 0.3 μm to 0.4 μm.

The support structure 300 includes any one of a first support layer 310 and a second support layer 320; or, the support structure 300 includes a first support layer 310 and a second support layer 320 located on the first support layer 310.

In this form, an example in which the support structure 300 includes the first support layer 310 and the second support layer 320 located on the first support layer 310 is used for description. In this form, the material of the first support layer 310 is silicon nitride. Both the hardness and density of silicon nitride are relatively large, so that relatively high mechanical strength can providing, thereby improving the supporting effect of the support structure 300.

In this form, the semiconductor structure further includes: a first inside spacer 210, located on the side wall of the first metal gate 360; a second inside spacer 220, located on the side wall of the poly gate 200, where the second inside spacer 220 is the same as the material of the first inside spacer 210 and the first support layer 310; and an outer side spacer 230, located on side walls of the first inside spacer 210 and the second inside spacer 220.

The first inside spacer 210 is used for defining a forming position of the source/drain epitaxial layer and is further used for protecting the side wall of the first metal gate 360. The second inside spacer 220 is used for protecting the side wall of the poly gate 200.

In a process of forming the semiconductor structure, before the first source/drain doping region 130 and the second source/drain doping region 240 are formed, the poly gates are formed on the base 100 in both the first device region 100H and the second device region 100L. The step of forming the source/drain epitaxial layer includes: in the first device region 100H, forming a hard mask layer on the top and side wall of the poly gate and a top surface of the base 100, where the hard mask layer exposes the poly gate in the second device region 100L and the top surface of the base 100; and forming the source/drain epitaxial layer in the base 100 on the two sides of the poly gate exposed from the hard mask layer. The step of forming the first support layer 310 includes: after the source/drain epitaxial layer is formed and before ion doping is performed on the source/drain epitaxial layer to form the second source/drain doping region 240, in the first device region 100H, removing the hard mask layer located on the top of the poly gate and top surfaces of the preset regions 100S and the well pick-up region 100P, and keeping the hard mask layer located on the first isolation structure 110 for use as the first support layer 310.

The material of the first inside spacer 210 is the same as the material of the first support layer 310 because in the step of forming the hard mask layer, the first inside spacer located on the side wall of the poly gate in the second device region 100L is formed. In addition, the material of the second inside spacer 220 and the first inside spacer 210 is the same as the material of the first support layer 310 because in the first device region, that is, in the first device region 100H, in the step of removing the hard mask layer located on the top of the poly gate and the top surfaces of the preset regions 100S and the well pick-up region 100P, the remaining hard mask layer located on the side wall of the poly gate 200 in the first device region 100H is kept for use as the second inside spacer 220.

In an example, the material of the outer side spacer 230 is silicon nitride.

In this form, the support structure 300 includes the second support layer 320. The base 100 further includes a functional region used for forming a functional structure. The semiconductor structure further includes: a salicide block (SAB) layer (not shown in the figure), located in a partial region of the base 100 in the functional region, where the material of the SAB layer is the same as the material of the second support layer 320.

The material of the SAB layer is the same as the material of the second support layer 320 because the SAB layer is formed at the same time in the step of forming the second support layer 320, to integrate the process step of forming the second support layer 320 and the process step of forming the SAB layer, thereby improving the integration level and compatibility of the process.

The SAB layer exposes a region in which the metal silicide layer is intended to be formed, and is used for protecting a region in which the metal silicide layer is not intended to be formed. Specifically, in this form, the SAB layer is used for protecting the functional region to prevent the metal silicide layer from being formed in the partial region in the functional region.

In this form, the material of the SAB layer includes one or more of silicon oxide, silicon nitride, and silicon oxynitride. Specifically, the material of the SAB layer is the same as the material of the second support layer 320, and the material of the SAB layer is silicon nitride.

Correspondingly, the semiconductor structure further includes: a metal silicide layer 330, located between the top surface of the first source/drain doping region 130 exposed from the SAB layer and the interlayer dielectric layer 340, between a top surface of the well pick-up region 100P and the interlayer dielectric layer 340, and between a top surface of the second source/drain doping region 240 and the interlayer dielectric layer 340.

The semiconductor structure usually further includes: contact hole plugs (not shown in the figure) that are respectively correspondingly located on the top surface of the first source/drain doping region 130, the second source/drain doping region 240, and the well pick-up region 100P. The metal silicide layer 330 is used for reducing contact resistance between the first source/drain doping region 130, the second source/drain doping region 240, and the well pick-up region 100P and the corresponding contact hole plugs, to correspondingly improve the performance of the semiconductor structure.

In this form, the material of the metal silicide layer 330 may be a nickel silicon compound, a cobalt silicon compound or a titanium silicon compound.

The interlayer dielectric layer 340 is used for isolating adjacent devices.

In this form, the support structure 300 can achieve a supporting effect in the planarization process of forming the interlayer dielectric layer 340, to avoid over-polishing in the interlayer dielectric layer 340 above the first isolation structure 110, which is conducive to mitigating a problem of top surface dishing and a reduced thickness of the interlayer dielectric layer 340 above the first isolation structure 110. Therefore, a top surface of the interlayer dielectric layer 340 has relatively high flatness and height consistency, which is conducive to improving the performance of the semiconductor structure.

In this form, the material of the interlayer dielectric layer 340 is silicon oxide.

In this form, for ease of illustration and description, only the interlayer dielectric layer 340 is shown in the sectional view. In addition, in this form, for ease of the illustration of the specific structure in the first device region 100H, only the position in the second device region 100L is shown in the top view. For the specific structure in the second device region 100L, refer to a corresponding sectional view.

Correspondingly, the present disclosure further provides a method for forming a semiconductor structure. FIG. 8 to FIG. 23 are schematic structural diagrams corresponding to steps in one form of a method for forming a semiconductor structure according to the present disclosure.

One form of a method for forming a semiconductor structure is described below in detail with reference to the accompanying drawings.

Figure 8:
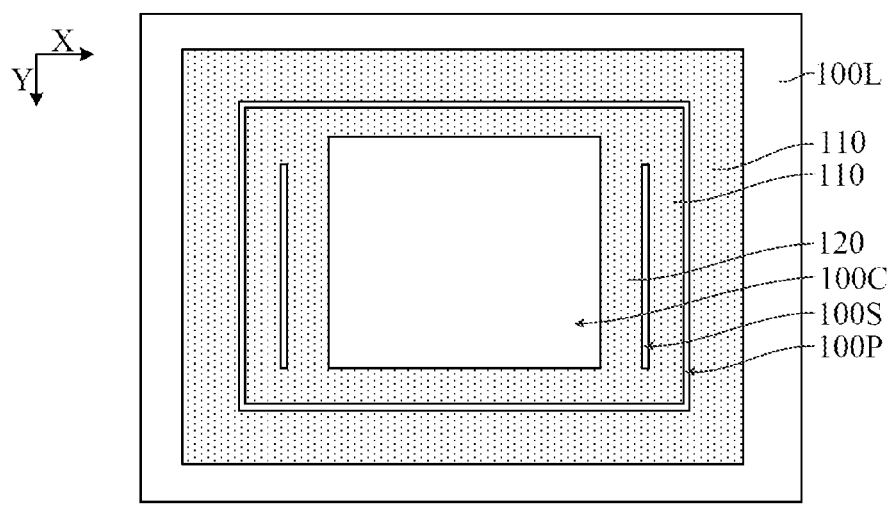
FIG. 8 to FIG. 23 are schematic structural diagrams corresponding to steps in one form of a method for forming a semiconductor structure according to the present disclosure.
Figure 9:
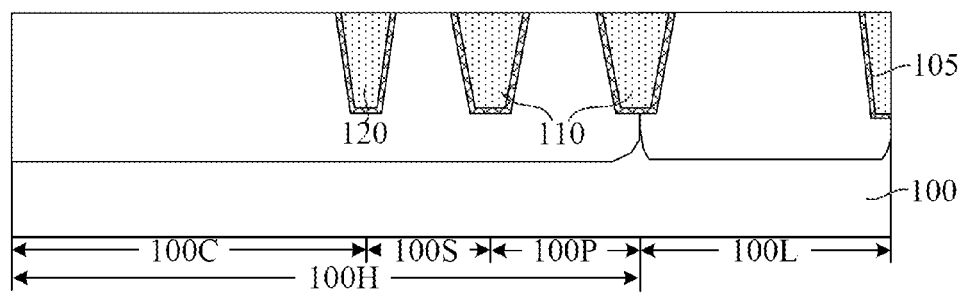

FIG. 8 is a top view, and FIG. 9 is a partial sectional view of FIG. 8 in a length direction of a channel region. A base 100 is provided, including a first device region 100H used for forming a first device and a second device region 100L used for forming a second device. A channel length of the first device is greater than a channel length of the second device. The base 100 in the first device region 100H includes a channel region 100C, preset regions 100S located on two sides of the channel region 100C in a length direction of the channel region 100C (as shown by a direction X in FIG. 8) and used for forming a first source/drain doping region, and a well pick-up region 100P surrounding the channel region 100C and the preset regions 100S. A first isolation structure 110 is formed in the base 100 between the preset regions 100S and the well pick-up region 100P and between the well pick-up region 100P and the adjacent second device region 100L.

The base 100 is configured to provide a platform for subsequent process procedures.

In this form, an example in which the base 100 is used for forming a planar field effect transistor is used. The base 100 is a planar base. In this form, the base 100 is a silicon substrate. In other forms, the material of the base may be alternatively germanium, silicon-germanium, silicon carbide, gallium arsenide or indium gallium, among other materials.

In some other forms, according to the type of the actually formed transistor, the base may be alternatively a three-dimensional base.

The channel length of the first device is greater than the channel length of the second device, and an operating voltage of the first device is higher than an operating voltage of the second device.

In this form, the first device includes one or two of an MV device and an HV device, and the second device is an LV device. The operating voltages of the LV device, the MV device, and the HV device sequentially increase. In an example, the operating voltage of the LV device is less than 1.5 V, the operating voltage of the MV device is 1 V to 10 V, and the operating voltage of the HV device is greater than 10 V.

In this form, an example in which the first device is an HV device and the second device is an LV device is used for description. Specifically, the second device is a core device.

It needs to be noted that the first device may be an NMOS transistor or a PMOS transistor. Similarly, the second device may also be an NMOS transistor or a PMOS transistor. In an example, the first device is an NMOS transistor, and the second device is a PMOS transistor.

In this form, a well region (not shown) is formed in the base 100. Channels of the well region and the transistor have different conductivity types. To form an NMOS transistor, the well region is doped with P-type ions. To form a PMOS transistor, the well region is doped with N-type ions.

In an example, the first device is an NMOS transistor. The well region in the first device region 100H is a P-type doped deep well region. Specifically, the well region in the first device region 100H is a P-type doped deep well region of an HV device, to enable the first device to bear a relatively large operating voltage.

In an example, the second device is a PMOS transistor, and the well region in the second device region 100L is an N-type doped well region.

The base 100 in the first device region 100H includes a channel region 100C. When the first device operates, a conductive channel is formed in the base 100 of the channel region 100C. Specifically, the channel region 100C is located in the well region.

In this form, the length direction of the channel region 100C is a movement direction of carriers in the conductive channel when the device operates. Specifically, the first source/drain doping region is subsequently formed in the preset regions 100S. The first source/drain doping region includes a source region and a drain region that are respectively located on two sides of a poly gate. A direction from the drain region to the source region is the length direction of the channel region 100C. In this form, the length direction of the channel region 100C is shown by the direction X in FIG. 8, and a direction perpendicular to the length direction of the channel region 100C is a width direction of the channel region 100C (shown by a direction Y in FIG. 8).

The preset regions 100S are used for forming the first source/drain doping region. The preset regions 100S are located on the two sides of the channel region 100C in the length direction of the channel region 100C. The preset regions 100S are long strip structures extending in the width direction of the channel region 100C.

The well pick-up region 100P is used for implementing an electrical connection between the well region and an external circuit or another interconnection structure. Specifically, the contact hole plug in contact with the well pick-up region 100P is subsequently formed above the well pick-up region 100P, to supply a substrate potential to the base through the contact hole plug.

In this form, the well pick-up region 100P is a closed annular structure, and is further used as a guard ring for isolating external coupling noise.

The first isolation structure 110 is used for isolating the well pick-up region 100P from the subsequently formed first source/drain doping region, and is further used for isolating the well pick-up region 100P from adjacent devices. In this form, the first isolation structure 110 located on an outer side of the well pick-up region 100P surrounds the well pick-up region 100P. Correspondingly, the first isolation structure 110 located on the outer side of the well pick-up region 100P is also an annular structure.

In this form, a second isolation structure 120 is further formed in the base 100 between the channel region 100C and the preset regions 100S. The second isolation structure 120 is used for increasing a movement path of carriers between a source/drain doping region and a conductive channel, to improve the voltage endurance of the first device.

Specifically, a first trench (not shown) is formed in the base 100 between the well pick-up region 100P and the channel region 100C in a width direction of a channel region and between the well pick-up region 100P and the adjacent second device region 100L, a second trench (not shown) is formed in the base 100 between the channel region 100C and the preset regions 100S. The first isolation structure 110 is located in the first trench, and the second isolation structure 120 is located in the second trench.

Correspondingly, the first trench and the second trench are used for defining an AA in the base 100 in the first device region 100H. That is, the base 100 in the first device region 100H isolated by the first trench and the second trench is an AA.

Specifically, in this form, the channel region 100C, the preset regions 100S, and the well pick-up region 100P isolated by the first isolation structure 110 and the second isolation structure 120 are AAs.

In this form, the first isolation structure 110 and the second isolation structure 120 are both STI structures. The material of the first isolation structure 110 and the second isolation structure 120 is an insulating material, for example, silicon oxide, silicon nitride, or silicon oxynitride.

A lining layer 105 is further formed between the first isolation structure 110 and the side walls and the bottom of the first trench and between the second isolation structure 120 and the side walls and the bottom of the second trench.

The lining layer 105 is used for improving the interface quality of bottom surfaces and the side walls of the first trench and the second trench, to further improve the forming quality of the first isolation structure 110 and the second isolation structure 120. In an example, the material of the lining layer 105 is silicon oxide.

In this form, the base 100 further includes a third device region (not shown in the figure) used for forming a third device. Channels of the third device and the second device have different conductivity types. In this form, the third device is also an LV device, and a channel length of the third device is less than the channel length of the first device.

In this form, the second device is a PMOS transistor, and the third device is correspondingly an NMOS transistor. In this form, the base 100 further includes a functional region (not shown in the figure) used for forming a functional structure.

The functional structure includes a resistor structure, a capacitor structure, a diode, a bipolar junction transistor, and the like. In an example, the functional region is used for forming the resistor structure.

Figure 10:
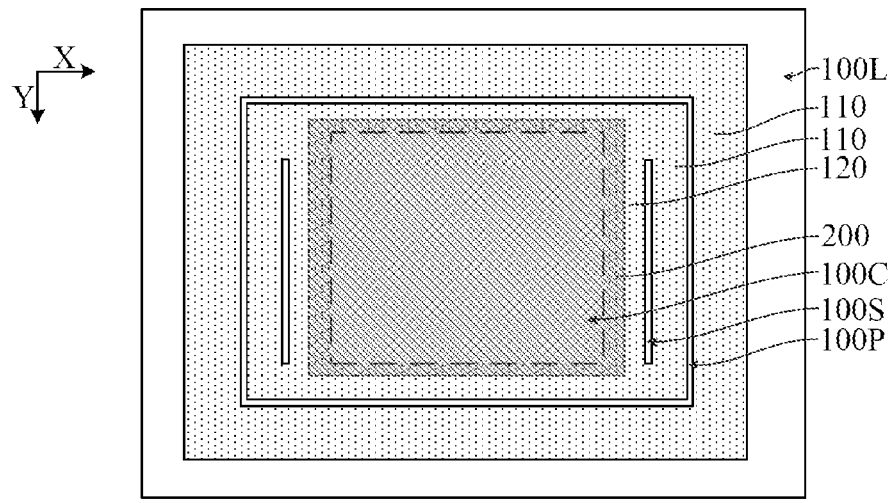
Figure 11:
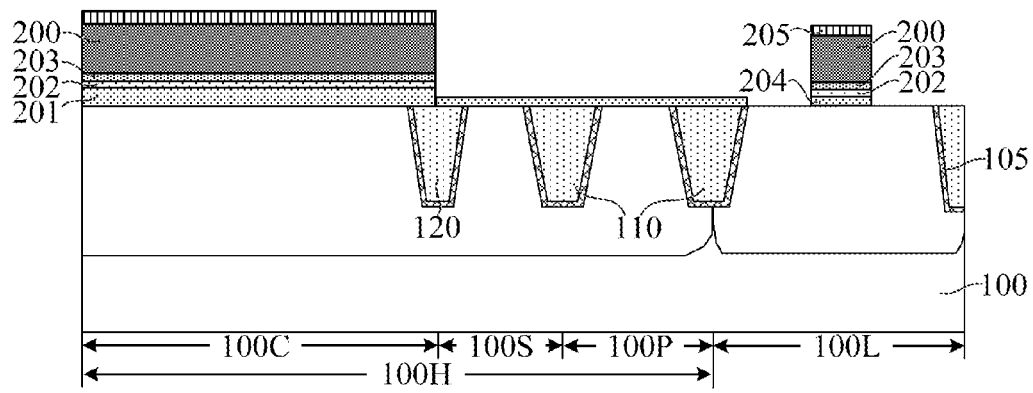

FIG. 10 is a top view, and FIG. 11 is a partial sectional view of FIG. 10 in a length direction of a channel region. Discrete poly gates 200 are formed on the base 100 in the first device region 100H and the second device region 100L. The poly gate 200 located in the first device region 100H covers the channel region 100C.

The poly gate 200 in the first device region 100H is used as a device gate structure of the first device, to control the opening or closing of a conductive channel of the first device. The poly gate 200 in the second device region 100L is used as a dummy gate, to occupy a spatial position for forming a metal gate subsequently.

Subsequently, after an interlayer dielectric layer is formed on the base 100 at the side portion of the poly gate 200, the poly gate 200 in the second device region 100L is removed to form a gate opening, and the metal gate is formed in the gate opening. A process of forming the metal gate usually includes a step of planarizing a metal gate material. When the size of the metal gate is larger, in a planarization process, a problem of top surface dishing is more likely to occur at the metal gate. The first device region 100H is used for forming the first device, the channel length of the first device is greater than the channel length of the second device, and a gate of the first device correspondingly has a relatively large size. Therefore, the poly gate 200 is used in the first device, to avoid using the metal gate in the first device, which is conducive to avoiding a problem of top surface dishing of the metal gate caused by the relatively large gate in the first device region 100H. In this form, the material of the poly gate 200 is polysilicon.

In this form, the poly gate 200 located in the first device region 100H covers the base 100 of the channel region 100C, and further extends to cover a part of the second isolation structure 120.

In this form, the step of forming the poly gate 200 includes: forming a poly gate material layer (not shown in the figure) on the base 100; forming a gate hard mask layer 205 on the poly gate material layer; and patterning the poly gate material layer by using the gate mask layer 205 as a mask, keeping the poly gate material layer located on the base 100 of the channel region 100C and a part of the poly gate material layer located on the base 100 in the second device region 100L as the poly gate 200.

The gate mask layer 205 is used as a mask for patterning the poly gate material layer. In this form, the material of the gate mask layer 205 is silicon nitride.

It needs to be noted that, in this form, before the poly gate material layer is formed, the forming method further includes: forming a high-k gate dielectric material layer and a cap material layer sequentially stacked from bottom to top on the base 100. Correspondingly, in a process of patterning the poly gate material layer, the high-k gate dielectric material layer and the metal block material layer are further patterned, to form a high-k gate dielectric layer 202 and a cap layer 203.

In this form, the material of the high-k gate dielectric layer 202 is a high-k dielectric material. In an example, the material of the high-k gate dielectric layer 202 is $HfO_2$.

In this form, the cap layer 203 is used for isolating the high-k gate dielectric layer 202 from the poly gate 200 and isolating the high-k gate dielectric layer 202 from the subsequently formed metal gate, to protect the high-k gate dielectric layer 202. In addition, in the process of removing the poly gate 200 in the second device region 100L subsequently, the cap layer 203 is further used as an etch stop layer, to reduce a probability that the high-k gate dielectric layer 202 is damaged. In addition, after the metal gate is formed on the second device region 100L subsequently, the cap layer 203 is further used for stopping easily diffusible ions in the metal gate from diffusing to the high-k gate dielectric layer 202. The cap layer 203 also has particular impact on a gate work function of the second device.

The material of the cap layer 203 includes one or two of TiN and TiSiN. In this form, the material of the cap layer 203 is TiN.

It further needs to be noted that, in this form, in the process of forming the poly gate 200, a gate oxide layer 201 is further formed between the high-k gate dielectric layer 202 and the base 100 in the first device region 100H. An interface buffer layer 204 is further formed between the high-k gate dielectric layer 202 and the base 100 in the second device region 100L. The thickness of the interface buffer layer 204 is less than the thickness of the gate oxide layer 201.

The gate oxide layer 201 is used for isolating the poly gate 200 from the channel of the first device. The interface buffer layer 204 is used as an interface buffer layer between the high-k gate dielectric layer 202 and the base 100 in the second device region 100L, which is conducive to improving electron mobility, interface stability and device reliability.

The material of the gate oxide layer 201 and the interface buffer layer 204 is silicon oxide or silicon oxynitride. In this form, the material of the gate oxide layer 201 and the interface buffer layer 204 is silicon oxide.

In this form, for ease of illustration and description, only the interface buffer layer 204 and the gate mask layer 205 are shown in the sectional view. In addition, in this form, for ease of the illustration of the device structure in the first device region 100H, only the position in the second device region 100L is shown in the top view. For the specific structure in the second device region 100L, refer to a corresponding sectional view.

Figure 13:
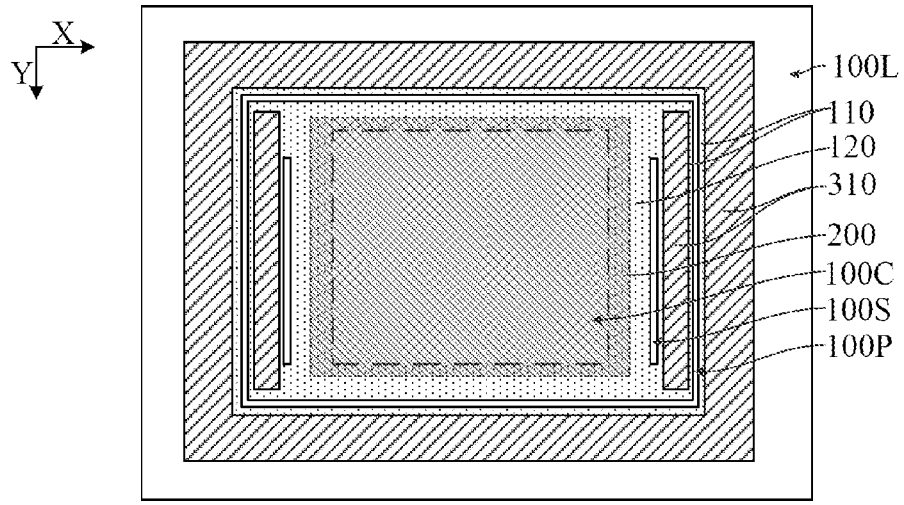
Figure 14:
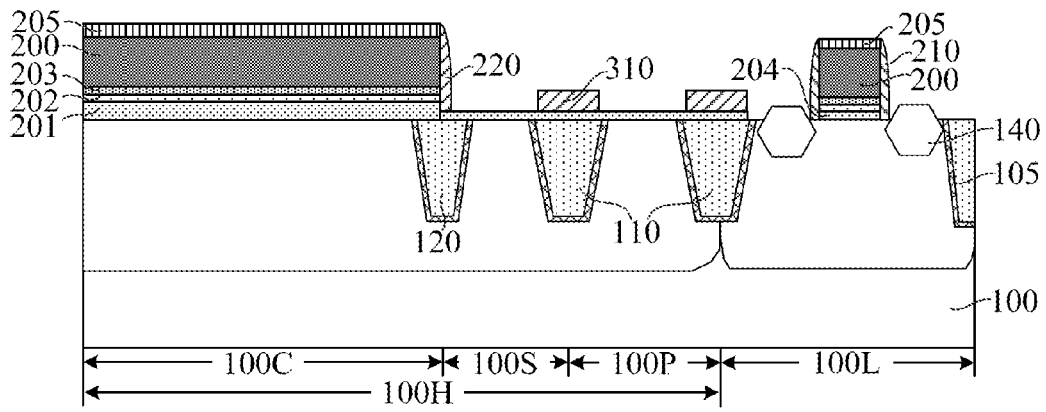
Figure 15:
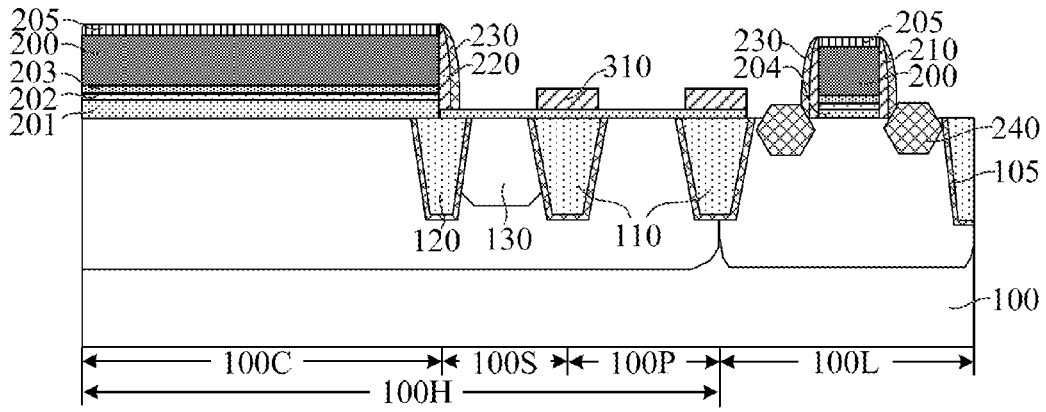

Referring to FIG. 12 to FIG. 15, the first source/drain doping region 130 (as shown in FIG. 15) is formed in the preset regions 100S on two sides of the poly gate 200 in the first device region 100H; and a second source/drain doping region 240 (as shown in FIG. 15) is formed in the base 100 on the two sides of the poly gate 200 in the second device region 100L.

Figure 16:
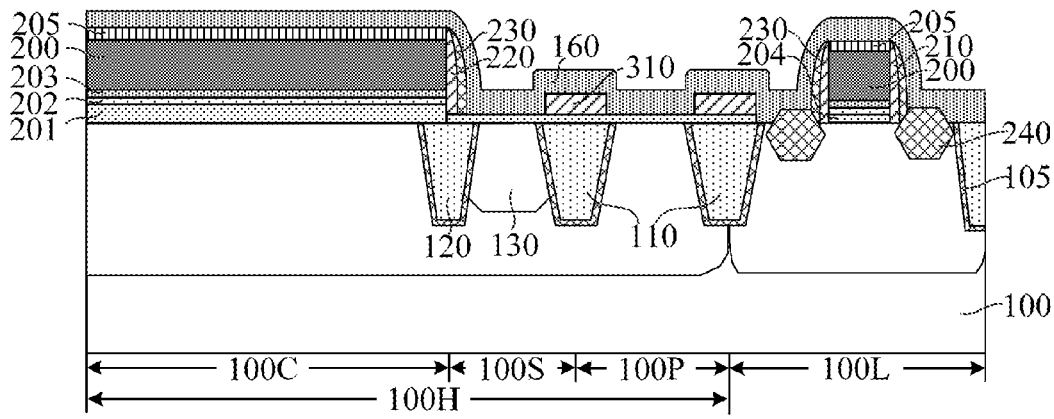
Figure 17:
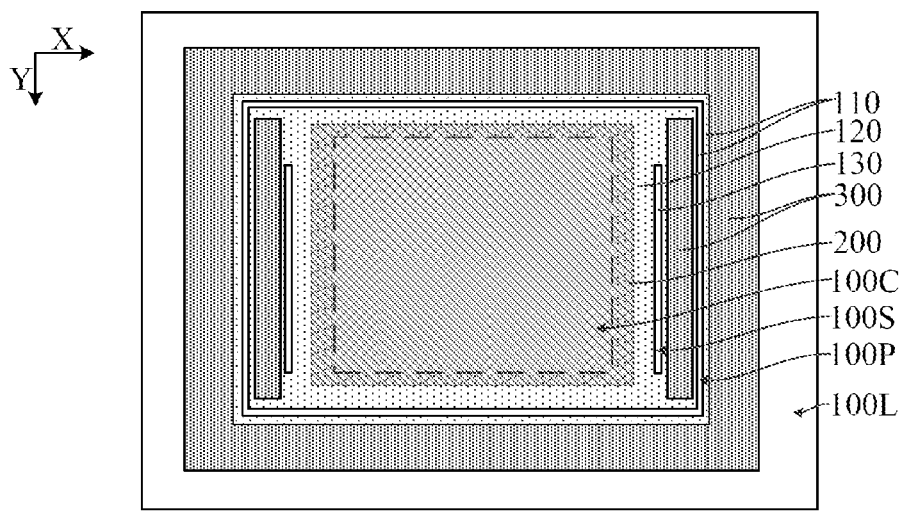
Figure 18:
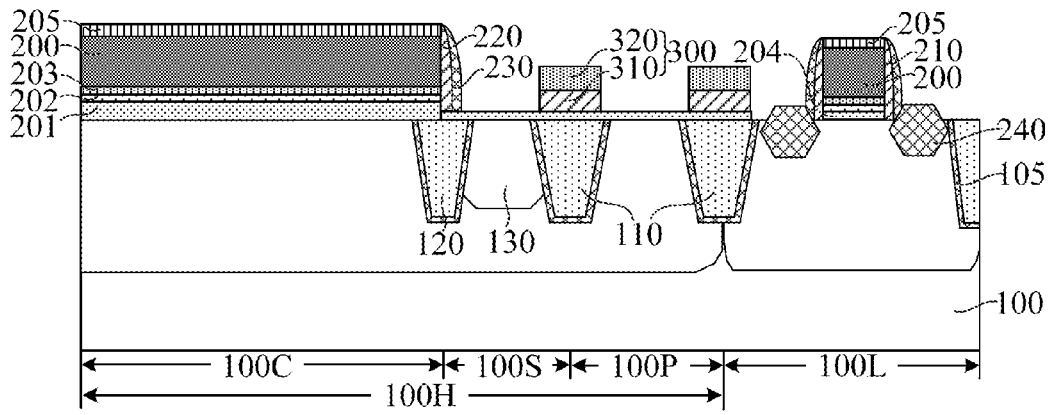

Referring to FIG. 12 to FIG. 18 together, a support structure 300 (as shown in FIG. 18) is formed in the first isolation structure 110 exposed from the poly gate 200.

The subsequent steps further include: forming the interlayer dielectric layer on the base 100 at the side portion of the poly gate 200, and exposing the top of the poly gate 200 in the second device region 100L; and removing the poly gate 200 in the second device region 100L, and forming a gate opening in the interlayer dielectric layer; and forming the metal gate in the gate opening.

The support structure 300 is further formed on the first isolation structure 110 exposed from the poly gate 200. The support structure 300 can achieve a supporting effect in a planarization process of forming the interlayer dielectric layer and the metal gate, to avoid over-polishing the interlayer dielectric layer above the first isolation structure 110, which is conducive to mitigating problems of top surface dishing and a reduced thickness of the interlayer dielectric layer above top surfaces of the preset regions 100S and the well pick-up region 100P. In addition, because the support structure 300 that can achieve a supporting effect is provided on the base 100 around the first source/drain doping region 130 and the well pick-up region 100P, the support structure 300 can further protect the first source/drain doping region 130 and the well pick-up region 100P, which is conducive to avoiding contacting top surfaces of the first source/drain doping region 130 and the well pick-up region 100P during planarization. The top surfaces of the first source/drain doping region 130 and the well pick-up region 100P are usually further formed with a metal silicide layer, which is correspondingly conducive to avoiding contacting the metal silicide layer located on the top surfaces of the first source/drain doping region 130 and the well pick-up region 100P during planarization, and is further conducive to avoiding causing metal contamination on a planarization machine. In summary, this embodiment is conducive to improving the performance of the semiconductor structure and the yield of production and manufacturing.

A material with relatively high hardness is chosen for the support structure 300, to ensure that the support structure 300 can achieve a supporting effect and a polishing protection effect in the subsequent planarization process of forming the interlayer dielectric layer and the metal gate. In this form, the material of the support structure 300 includes one or more of silicon nitride, silicon oxynitride, silicon carbide, silicon oxycarbide, silicon oxy-carbonitride, boron nitride, and boron carbonitride.

It should be noted that, in this form, a top surface of the support structure 300 is level with a top surface of the poly gate 200 in the second device region 100L, or a top surface of the support structure 300 is lower than a top surface of the poly gate 200 in the second device region 100L.

In the planarization process of forming the interlayer dielectric layer, the top surface of the poly gate 200 in the second device region 100L usually needs to be exposed, to make it convenient to subsequently remove the poly gate 200 in the second device region 100L. In addition, the subsequent process of forming the metal gate on the second device region 100L includes: planarizing a metal gate material layer, and removing the metal gate material layer located on a top surface of the interlayer dielectric layer. In this form, the top surface of the support structure 300 is not higher than the top surface of the poly gate 200 in the second device region 100L, to avoid adverse impact on the subsequent planarization process of forming the interlayer dielectric layer and the metal gate.

In this form, an example in which the top surface of the support structure 300 is lower than the top surface of the poly gate 200 is used for description.

In direction of perpendicular to the surface of the base 100, a height difference between the top surface of the support structure 300 and the top surface of the poly gate 200 in the second device region 100L should not be excessively large. When the top surface of the support structure 300 is lower than the top surface of the poly gate 200 in the second device region 100L, if the height difference is excessively large, the thickness of the support structure 300 is correspondingly excessively small as a result, the risk that the support structure 300 is removed in the planarization process of forming the interlayer dielectric layer and the metal gate tends to be increased, and the supporting effect of the support structure 300 tends to be inadequate.

In view of this, in this form, in the surface normal direction of the base 100, the height difference between the top surface of the support structure 300 and the top surface of the poly gate 200 in the second device region 100L is less than or equal to 500 Å.

In an example, in the surface normal direction of the base 100, the height difference between the top surface of the support structure 300 and the top surface of the poly gate 200 in the second device region 100L is 100 Å to 500 Å.

Specifically, in this form, the thickness of the support structure 300 is 280 nm.

In this form, the width of isolation structure 300 is shorter than width of first isolation structure 110. And in the width direction of the first isolation structure 110, the pattern of isolation structure 300 must be totally inside of the pattern of first isolation structure 110 totally enclosure of two sides, to reserve a process window for an overlay shift or critical dimension in a photo process for forming the support structure 300. So that the support structure 300 is prevented from being formed overlap with the first source/drain doping region 130 and the well pick-up region 100P due to the overlay or critical dimension shift, and it is correspondingly ensured that metal silicide is formed fully cover both the top surfaces of the first source/drain doping region 130 and the well pick-up region 100P in a subsequent process of performing a metal silicide process, thereby increasing a process window of the photo process for forming the support structure 300.

To ensure that a enough distance which the pattern of support structure 300 is enclosed by the pattern of first isolation structure 110 can compensate for the overlay or critical dimension shift in the photo process and to ensure that the area of the support structure 300 is not excessively small to enable the support structure 300 to achieve a sufficient supporting effect. In this form, in the width direction of the first isolation structure 110, the distance which the pattern of support structure 300 is enclosed by the pattern of first isolation structure 110 is 0.3 μm to 0.4 μm.

The support structure 300 includes any one of a first support layer 310 and a second support layer 320.

Alternatively or additionally, the support structure 300 includes a first support layer 310 and a second support layer 320 located on the top of the first support layer 310.

In this form, an example in which the support structure 300 includes the first support 310 and the second support layer 320 located on the first support layer 310 is used for illustration.

Detailed description is made below on the step of forming the first source/drain doping region 130, the second source/drain doping region 240, and the support structure 300 in this form with reference to the accompanying drawings.

Figure 12:
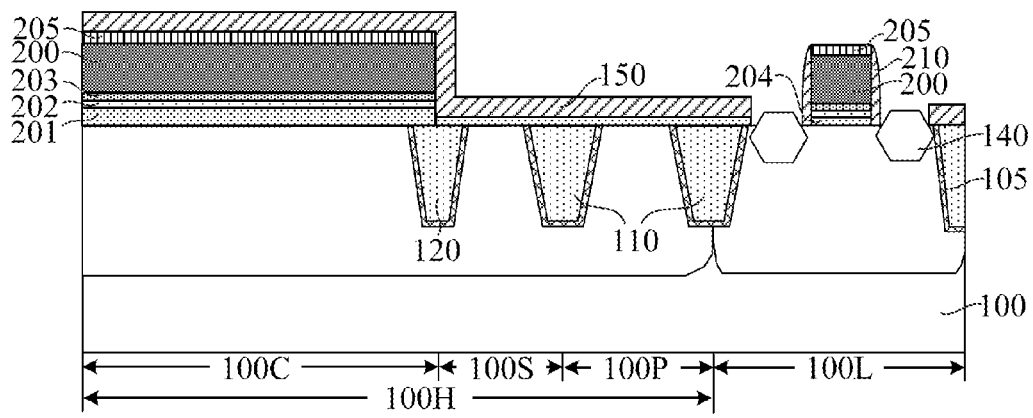

Referring to FIG. 12, a source/drain epitaxial layer 140 is formed in the base 100 on the two sides of the poly gate 200 in the second device region 100L. The source/drain epitaxial layer 140 is used for forming the second source/drain doping region through subsequent ion doping process. The source/drain epitaxial layer 140 is further used for providing the stress forced on the channel of the second device, to improve the carrier mobility. In this form, the source/drain epitaxial layer 140 is further doped with ions.

In this form, the second device region 100L is used for forming a PMOS transistor, the source/drain epitaxial layer 140 includes a stress layer doped with P-type ions. the material of the stress layer is SiGe, and the stress layer supplies a compressive stress to a channel region of the PMOS transistor, thereby improving the carrier mobility of the channel of the PMOS transistor.

In this form, the step of forming the source/drain epitaxial layer 140 includes: in the first device region 100H, forming a protect layer 150 in first device region 100H and exposes the poly gate 200 and the top surface of the base 100 in the second device region 100L; then forming the source/drain epitaxial layer 140 in the base 100 on the two sides of the poly gate 200 exposed from the hard mask layer 150.

In this form, the base 100 further includes a third device region used for forming a third device. The channel length of the third device is less than the channel length of the first device. Channels of the third device and the second device have different conductivity types. In the step of forming the hard mask layer 150, the hard mask layer 150 is further formed in the third device region.

The hard mask layer 150 is used for protecting the first device region 100H and the third device region, to avoid formation of the source/drain epitaxial layer 140 in the first device region 100H and the third device region. In this form, the process of forming the source/drain epitaxial layer 140 further includes a process of etching the base 100 on the two sides of the poly gate 200 in the second device region 100L to form a recess cavity, and the hard mask layer 150 is further used as an etch mask for forming the recess cavity.

In this form, the material of the hard mask layer 150 is silicon nitride, silicon oxide or silicon oxynitride.

In this form, the method for forming a semiconductor structure further includes: in the step of forming the hard mask layer 150, forming a first inside spacer 210 located on the side wall of the poly gate 200 in the second device region 100L. The first inside spacer 210 is used for protecting the side wall of the poly gate 200 in the second device region 100L and is further used for defining a forming position of the source/drain epitaxial layer 140.

In this form, the step of forming the hard mask layer 150 and the first inside spacer 210 includes: forming a hard mask material layer (not shown in the figure) on the top and a side wall of the poly gate 200 and the top surface of the base 100; and removing the hard mask material layer located on the top of the poly gate 200 and the top surface of the base 100 in the second device region 100L, and keeping the remaining hard mask material layer located on the side wall of the poly gate 200 in the second device region 100L for using as the first inside spacer 210.

The hard mask material layer in the second device region 100L is etched by using an anisotropic dry etching process, until the hard mask material layer located on the top of the poly gate 200 and the top surface of the base 100 on the two sides of the poly gate 200 in the second device region 100L is removed. Because the anisotropic etching process has a low etching rate in a direction perpendicular to the side wall of the poly gate 200, a part of the hard mask material layer located on the side wall of the poly gate 200 in the second device region 100L is kept for use as the first inside spacer 210.

Specifically, the step of forming the source/drain epitaxial layer 140 in the base 100 on the two sides of the poly gate 200 exposed from the hard mask layer 150 includes: forming a recess cavity (not shown in the figure) in the base 100 on the two sides of the poly gate 200 in the second device region 100L by using the hard mask layer 150 as a mask; and forming the source/drain epitaxial layer 140 in the recess cavity.

In this form, a stress layer with in-situ doping ions is formed in the recess cavity by epitaxial process to form the source/drain epitaxial layer 140.

FIG. 13 is a top view, and FIG. 14 is a partial sectional view of FIG. 13 in the length direction of the channel region. The first support layer 310 is formed on the first isolation structure 110 exposed from the poly gate 200.

Subsequently, the method further includes: doping ions on the source/drain epitaxial layer 140, to use the source/drain epitaxial layer 140 doped with ions as the second source/drain doping region.

In this form, the step of forming the first support layer 310 includes: after the source/drain epitaxial layer 140 is formed and before ion doping on the source/drain epitaxial layer 140 and the base 100 in the first device region 100H, removing the hard mask layer 150 located on the top of the poly gate 200 and the top surfaces of the preset regions 100S and the well pick-up region 100P, and keeping the hard mask layer 150 located on the first isolation structure 110 for using as the first support layer 310.

The hard mask layer 150 located on the first isolation structure 110 is kept for use as the first support layer 310, which is based on an existing process without additional step, to correspondingly improve the process compatibility and reduce costs.

In this form, in the process of removing the hard mask layer 150 located on the top of the poly gate 200 and the top surfaces of the preset regions 100S and the well pick-up region 100P in the first device region 100H, the forming method further includes: removing the hard mask layer 150 located on the top surfaces of the poly gate 200 and the base 100 in the third device region, and exposing the base 100 on the two sides of the poly gate 200 in the third device region.

The base 100 on the two sides of the poly gate 200 in the third device region is exposed, to make it convenient to subsequently form a third source/drain doping region in the base 100 on the two sides of the poly gate 200 in the third device region.

In this form, the step of removing the hard mask layer 150 located on the poly gate 200 and the top surface of the base 100 in the third device region and located on the top surface of the poly gate 200 in the first device region 100H and the top surfaces of the preset regions 100S and the well pick-up region 100P includes: forming a mask layer by photo process, covering the second device region 100L and the hard mask layer 150 located on the top of the first isolation structure 110; etching the hard mask layer 150 with a mask layer as a mask by using the anisotropic etching process, until the hard mask layer 150 located on the top surfaces of the poly gate 200 and the base 100 in the third device region and located on the top surface of the poly gate 200 in the first device region 100H and the top surfaces of the preset regions 100S and the well pick-up region 100P is removed.

In this form, in the process of forming the first support layer 310, the hard mask layer 150 located on the top surface of the poly gate 200 in the third device region and the top surface of the base 100 and located on the top surface of the poly gate 200 in the first device region 100H and the top surfaces of the preset regions 100S and the well pick-up region 100P is removed, so that in the process of forming the first support layer 310, only need to redesign the pattern of the mask for forming the mask layer. Correspondingly, it is not necessary to additionally use one mask in the process of forming the first support layer 310, which improves the integration level and compatibility of the process of forming the first support layer 310 and the prior art and is also conducive to reducing costs and simplifying a process procedure.

It needs to be noted that, in this form, the forming method further includes: in the first device region 100H, in the step of removing the hard mask layer 150 located on the top of the poly gate 200 and the top surfaces of the preset regions 100S and the well pick-up region 100P, keeping the remaining hard mask layer 150 located on the side wall of the poly gate 200 in the first device region 100H for use as a second inside spacer 220.

The second inside spacer 220 is used for protecting the side wall of the poly gate 200.

Specifically, the hard mask layer 150 is etched selectively by photo process and the anisotropic etching process. The anisotropic etching process has a low etching rate in a direction perpendicular to the side wall of the poly gate 200. Therefore, the hard mask layer 150 located on the side wall of the poly gate 200 in the first device region 100H and the third device region is kept for a partial thickness for using as the second inside spacer 220.

Referring to FIG. 15, the forming method further includes: forming an outer side spacer 230 on side walls of the first inside spacer 210 and the second inside spacer 220. The outer side spacer 230 is used for defining the forming positions of the subsequent first source/drain doping region and the third source/drain doping region. In an example, the material of the outer side spacer 230 is silicon nitride.

The first source/drain doping region 130 is formed in the preset regions 100S on the two sides of the poly gate 200 in the first device region 100H; and the second source/drain doping region 240 is formed in the base 100 on the two sides of the poly gate 200 in the second device region 100L.

In this form, in the first device region 100H, after the hard mask layer 150 located on the top of the poly gate 200 and on the top surfaces of the preset regions 100S and the well pick-up region 100P is removed, the first source/drain doping region 130 and the second source/drain doping region 240 are formed.

The first source/drain doping region 130 is used as a source region or a drain region of the first device. In this form, the first device is an NMOS transistor, and the first source/drain doping region 130 is doped with N-type imp. In other embodiments, to form a PMOS transistor, the first source/drain doping region is doped with P-type imp.

In this form, after the first support layer 310 is formed, the forming method further includes: forming the third source/drain doping region (not shown in the figure) in the base 100 on the two sides of the poly gate 200 in the third device region.

The third source/drain doping region is used as a source region or a drain region of the third device. In this form, channels of the third device and the second device have different conductivity types. Correspondingly, the third source/drain doping region and the second source/drain doping region 240 have different doping types.

Specifically, the third device is an NMOS device, and the third source/drain doping region is correspondingly N-type doped.

In this form, the channels of the third device and the first device have the same conductivity type. Therefore, the first source/drain doping region 130 and the third source/drain doping region are formed in the same step.

In this form, ion doping is performed on the base 100 of the preset regions 100S and the base 100 on the two sides of the poly gate 200 in the third device region, to respectively correspondingly form the first source/drain doping region 130 and the third source/drain doping region. Specifically, an ion implantation process is used to perform ion doping.

The second source/drain doping region 240 is used as a source region or a drain region of the second device. Specifically, ion doping is performed on the source/drain epitaxial layer 140, to use the source/drain epitaxial layer 140 doped with ions as the second source/drain doping region 240. In this form, the second device is a PMOS transistor, and the source/drain epitaxial layer 140 is doped with P-type ions.

In this form, channels of the second device and the first device have different conductivity types. Therefore, the first source/drain doping region 130 and the second source/drain doping region 240 are separately formed in different steps.

Referring to FIG. 16 to FIG. 18, in this form, the support structure 300 includes the second support layer 320. After the first source/drain doping region 130 and the second source/drain doping region 240 are formed, the second support layer 320 is formed.

Specifically, in this form, the second support layer 320 is formed on the first support layer 310.

In this form, the forming method further includes: in the step of forming the second support layer 320, forming a SAB layer (not shown in the figure) on the base 100 in the functional region.

The SAB layer is formed at the same step of forming the second support layer 320, to integrate the process step of forming the second support layer 320 and the process step of forming the SAB layer, thereby improving the integration level and compatibility of the process.

The SAB layer is formed to expose a region in which the metal silicide layer is intended to be formed, and protects a region in which the metal silicide layer is not intended to be formed. Specifically, in this form, the SAB layer is used for protecting a partial region in the functional region to prevent the metal silicide layer from being formed in the partial region in the functional region.

In this form, the material of the SAB layer includes at least one of silicon oxide, silicon nitride, or silicon oxynitride. Specifically, the material of the SAB layer is the same as the material of the second support layer 320, and the material of the SAB layer is silicon nitride.

Specifically, the step of forming the second support layer 320 and the SAB layer is as follows:

As shown in FIG. 16, a block material layer 160 is formed on the top of and the side wall of the poly gate 200 and on the top surface of the base 100. In this form, the process of forming the block material layer 160 includes a chemical vapor deposition process or a furnace tube process. The chemical vapor deposition process and the furnace tube process have low costs and simple operations.

FIG. 17 is a top view, and FIG. 18 is a partial sectional view of FIG. 17 in a length direction of a channel region. The block material layer 160 located on the top and side wall of the poly gate 200 and on the top surfaces of the first source/drain doping region 130, the well pick-up region 100P, and the second source/drain doping region 240 is removed, and the block material layer 160 located on the first isolation structure 110 is kept for use as the second support layer 320, and the block material layer 160 located in the partial region in the functional region is kept for use as the SAB layer.

The step of removing the block material layer 160 located on the top of and the side wall of the poly gate 200 and on the top surfaces of the first source/drain doping region 130, the well pick-up region 100P, and the second source/drain doping region 240 includes a process of forming a mask transfer layer using a mask. In the process of removing the block material layer 160 located on the top and on the side wall of the poly gate 200 and on the top surfaces of the first source/drain doping region 130, the well pick-up region 100P, and the second source/drain doping region 240, the block material layer 160 located on the first isolation structure 110 is kept for use as the second support layer 320, so that it is only necessary to adjust the pattern of the mask to block the first isolation structure 110, which is conducive to integrating the step of forming the second support layer 320 and the step of forming the SAB layer. It is not necessary to additionally use a mask, which is conducive to reducing costs. In addition, compared with the prior art, the step of forming the second support layer 320 is not additionally performed, which is conducive to significantly improving the process compatibility and process integration level.

Figure 19:
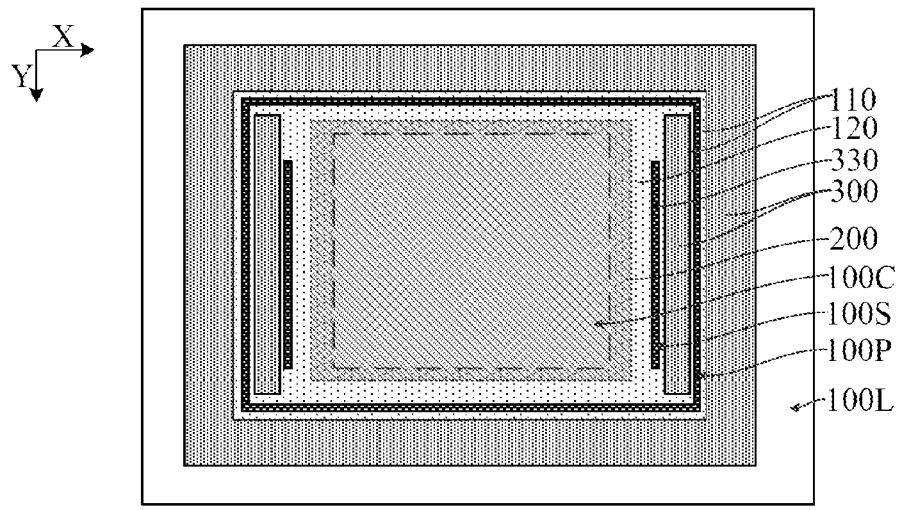
Figure 20:
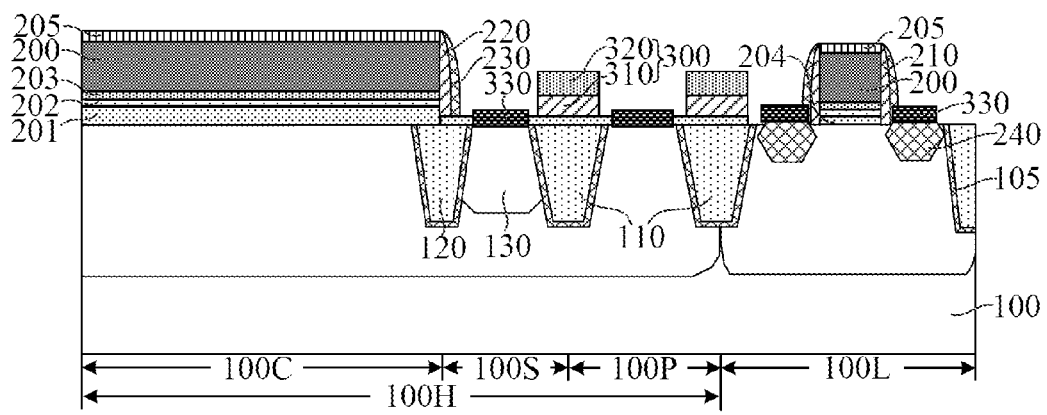

FIG. 19 is a top view. FIG. 20 is a partial sectional view of FIG. 19 in a length direction of a channel region. After the second support layer 320 and the SAB layer are formed, the metal silicide layer 330 is formed on the top surfaces of the first source/drain doping region 130 exposed from the SAB layer, the second source/drain doping region 240, and the well pick-up region 100P.

Subsequently, contact hole plugs are respectively correspondingly formed on the top surface of the first source/drain doping region 130, the second source/drain doping region 240, and the well pick-up region 100P. The metal silicide layer 330 is used for reducing contact resistance between the first source/drain doping region 130, the second source/drain doping region 240, and the well pick-up region 100P and the corresponding contact hole plugs, to correspondingly improve the performance of the semiconductor structure.

In this form, the material of the metal silicide layer 330 may be a nickel silicon compound, a cobalt silicon compound or a titanium silicon compound.

Figure 21:
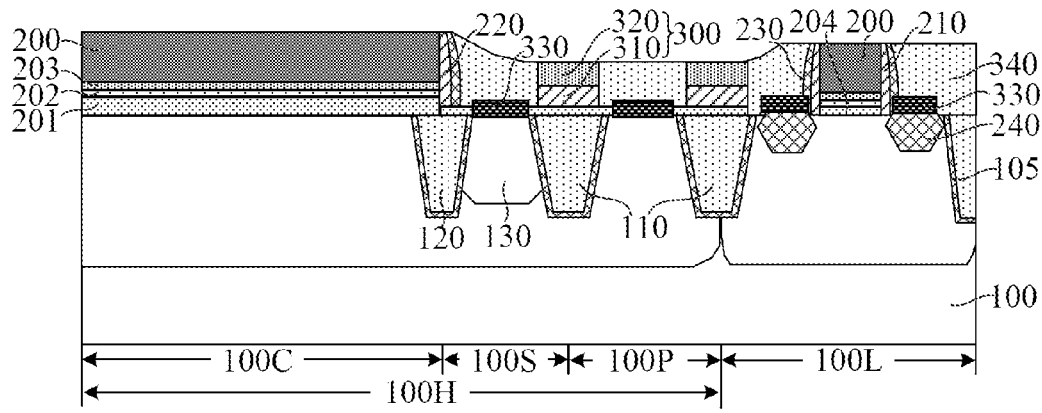

Referring to FIG. 21, the interlayer dielectric layer 340 is formed on the base 100 after the first source/drain doping region 130, the second source/drain doping region 240, and the support structure 300 are formed. The interlayer dielectric layer 340 covers side walls of the poly gate 200 and the support structure 300, and exposes the top of the poly gate 200 in the second device region 100L.

The support structure 300 can achieve a supporting effect in the planarization process of forming the interlayer dielectric layer 340, to avoid over-polishing polishing the interlayer dielectric layer 340 above the first isolation structure 110, which is conducive to mitigating problems of top surface dishing and a reduced thickness of the interlayer dielectric layer 340 above the first isolation structure 110, thereby improving the top surface flatness and height consistency of the interlayer dielectric layer 340. In addition, the support structure 300 can further protect the first source/drain doping region 130 and the well pick-up region 100P, which is conducive to avoiding contacting the top surfaces of the first source/drain doping region 130 and the well pick-up region 100P in the planarization process, is correspondingly conducive to preventing the metal silicide layer 330 from being polished, and is further conducive to avoiding causing metal contamination on a planarization machine.

The interlayer dielectric layer 340 is used for isolating adjacent devices. The interlayer dielectric layer 340 exposes the top of the poly gate 200 in the second device region 100L, to make it convenient to remove the poly gate 200 in the second device region 100L.

In this form, the interlayer dielectric layer 340 further exposes the top of the poly gate 200 in the third device region, to make it convenient to subsequently remove the poly gate 200 in the third device region.

The material of the interlayer dielectric layer 340 is an insulating material, and the material includes at least one of silicon oxide, silicon nitride, silicon oxynitride, silicon oxycarbide, silicon carbonitride, or silicon oxy-carbonitride. In this form, the material of the interlayer dielectric layer 340 is silicon oxide.

In this form, the step of forming the interlayer dielectric layer 340 includes: forming a dielectric material layer (not shown in the figure) covering the top surface and side wall of the poly gate 200 and the top surface and side wall of the support structure 300 on the base 100; and planarizing the dielectric material layer, and removing the dielectric material layer located on the top of the poly gate 200 in the second device region 100L.

In this form, the dielectric material layer is formed using a deposition process. The deposition process includes a chemical vapor deposition process. In this form, a process of planarization includes a chemical mechanical planarization (CMP) process.

In this form, in the process of planarizing the dielectric material layer, the gate mask layer 205, the first inside spacer 210, the second inside spacer 220, and the outer side spacer 230 are further planarized. After the dielectric material layer is planarized, the top surface of the poly gate 200 is exposed.

In this form, for ease of illustration and description, only the interlayer dielectric layer 340 is shown in the sectional view.

Figure 22:
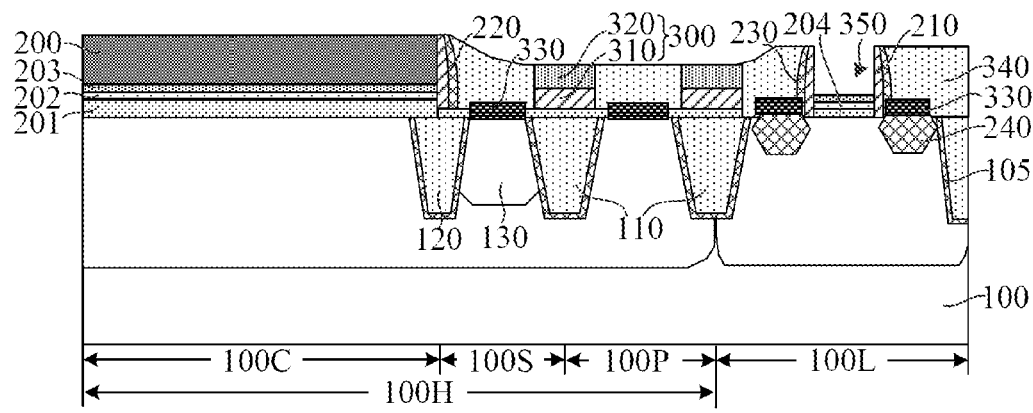

Referring to FIG. 22, the poly gate 200 in the second device region 100L is removed, and a gate opening 350 is formed in the interlayer dielectric layer 340.

The gate opening 350 is used as a first gate opening 350.

The first gate opening 350 is used for providing a spatial position for forming a first metal gate. In this form, the cap layer 203 is a block layer, to remove the poly gate 200 in the second device region 100L.

Figure 23:
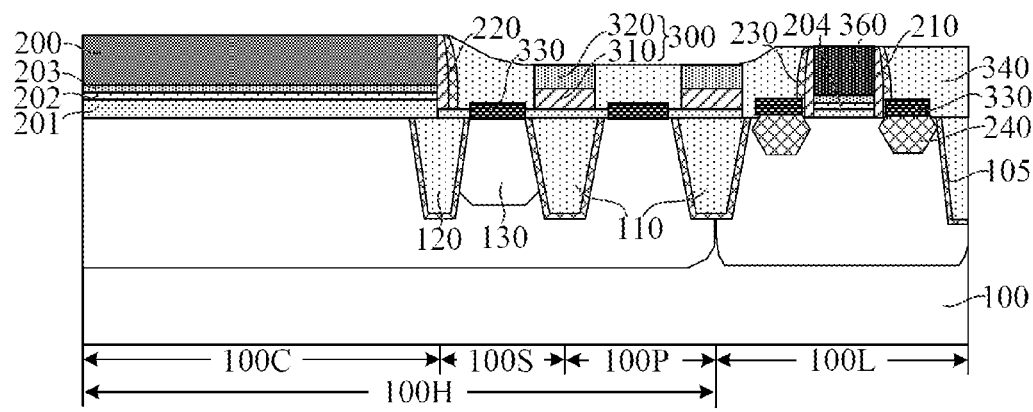

Referring to FIG. 23, the metal gate 360 is formed in the first gate opening 350. The metal gate 360 is used as the first metal gate 360. The high-k gate dielectric layer 202, the cap layer 203, and the first metal gate 360 in the second device region 100L are used for forming a metal gate structure. Because the channel length of the second device is relatively small, the operating voltage of the second device is relatively small. As the key size of a device keeps decreasing, the metal gate structure is used, which is conducive to mitigating a short-channel effect.

The first metal gate 360 is used for controlling the opening and closing of the conductive channel of the second device. The material of the first metal gate 360 is Al, Cu, Ag, Au, Pt, Ni, Ti, or W. In this form, the material of the first metal gate 360 is Al.

In this form, the step of forming the first metal gate 360 includes: filling a metal gate material layer (not shown in the figure) in the first gate opening 350, where the metal gate material layer is further formed on the top of the interlayer dielectric layer 340; and planarizing the metal gate material layer, and keeping the remaining metal gate material layer located in the first gate opening 350 for use as the first metal gate 360.

In this form, the process of forming the metal gate material layer includes one or more of an atom layer deposition process, a physical vapor deposition process, and an electrochemical plating process.

In this form, the support structure 300 can achieve a supporting effect in a process of planarizing a metal gate material layer, to avoid over-polishing in the interlayer dielectric layer 340 above the first isolation structure 110, which is conducive to mitigating problems of top surface dishing and a reduced thickness of the interlayer dielectric layer 340 above the first source/drain doping region 130 and the well pick-up region 100P, and is further conducive to avoiding contacting the top surfaces of the first source/drain doping region 130 and the well pick-up region 100P during planarization. This is correspondingly conducive to avoiding contact with the metal silicide layer 330 during planarization, and is further conducive to avoiding causing metal contamination on a planarization machine, thereby improving the performance of the semiconductor structure and the yield of production and manufacturing.

In this form, the process of planarization includes a CMP process.

In this form, for example, in the planarization process of forming the interlayer dielectric layer 340 and the first metal gate 360, the SAB layer located in the functional region is further kept for a partial thickness. In other forms, in the planarization process of forming the interlayer dielectric layer and the first metal gate, the SAB layer located in the functional region may be alternatively completely removed.

In this form, after the interlayer dielectric layer 340 is formed, the method for forming a semiconductor structure further includes: removing the poly gate 200 located in the third device region, and forming a second gate opening (not shown in the figure) in the interlayer dielectric layer 340 in the third device region; and forming a second metal gate in the second gate opening. The second metal gate is used for controlling the opening and closing of the conductive channel of the third device.

In this form, channels of the first device and the second device have different conductivity types. The first metal gate 360 and the second metal gate include different types of work function materials. Therefore, the poly gate 200 in the second device region 100L and the poly gate 200 in the third device region are respectively removed in different steps, and the first metal gate 360 and the second metal gate are respectively formed in different steps, which is conducive to preventing the steps of forming the first metal gate 360 and the second metal gate from affecting each other.

For detailed description of the material and forming steps of the second metal gate, reference may be made to the corresponding description of the first metal gate 360, as details are not described herein again.

Although forms of the present disclosure are described above, the present disclosure is not limited thereto. A person skilled in the art can make various changes and modifications without departing from the spirit and the scope of the present disclosure. Therefore, the protection scope of the present disclosure should be subject to the scope defined by the claims.

What is claimed is:

1. A semiconductor structure, comprising:
   a base, comprising:
      a first device region configured to form a first device and a second device region configured to form a second device, wherein a channel length of the first device is greater than a channel length of the second device, and the base in the first device region comprises a channel region,
      preset regions located on two sides of the channel region in a length direction of the channel region, and
      a well pick-up region surrounding the channel region and the preset regions;
   a first isolation structure, located in the base between the preset regions and the well pick-up region and between the well pick-up region and the adjacent second device region;
   a poly gate, covering the base of the channel region;
   a first source/drain doping region, located in the base in the preset regions on two sides of the poly gate;
   a metal gate, located on the base in the second device region;
   a second source/drain doping region, located in the base on two sides of the metal gate; and
   a support structure, located on the top of the first isolation structure; and an interlayer dielectric layer, located on the base, and covering side walls of the poly gate, the metal gate, and the support structure.

2. The semiconductor structure according to claim 1, wherein:
   the support structure comprises at least one of a first support layer or a second support layer; or the support structure comprises a first support layer and a second support layer located on the first support layer.

3. The semiconductor structure according to claim 2, wherein:
the support structure comprises the first support layer; and
the second source/drain doping region comprises a source/drain epitaxial layer.

4. The semiconductor structure according to claim 3, wherein the semiconductor structure further comprises:
a first inside spacer, located on the side wall of the metal gate; and
a second inside spacer, located on the side wall of the poly gate,
wherein the material of the second inside spacer is the same as the material of the first inside spacer and the first support layer.

5. The semiconductor structure according to claim 2, wherein:
the support structure comprises the second support layer;
the base further comprises a functional region used for forming a functional structure; and
the semiconductor structure further comprises:
a salicide block (SAB) layer, located in a partial region in the functional region, wherein the material of the SAB layer is the same as the material of the second support layer; and
a metal silicide layer, located between a top surface of the first source/drain doping region exposed from the SAB layer and the interlayer dielectric layer, between a top surface of the well pick-up region and the interlayer dielectric layer, and between a top surface of the second source/drain doping region and the interlayer dielectric layer.

6. The semiconductor structure according to claim 1, wherein in a width direction of the first isolation structure, the side wall of the support structure is indented relative to a side wall on the same side of the first isolation structure.

7. The semiconductor structure according to claim 6, wherein in the width direction of the first isolation structure, the side wall of the support structure is indented relative to the side wall on the same side of the first isolation structure by 0.3 µm to 0.4 µm.

8. The semiconductor structure according to claim 1, wherein the material of the support structure comprises at least one of silicon nitride, silicon oxynitride, silicon carbide, silicon oxycarbide, silicon oxy-carbonitride, boron nitride, or boron carbonitride.

9. The semiconductor structure according to claim 1, wherein the semiconductor structure further comprises:
a second isolation structure, located in the base between the channel region and the first source/drain doping region, wherein the poly gate covers the base of the channel region, and further extends to cover a part of the second isolation structure.

10. A method for forming a semiconductor structure, comprising:
providing a base, comprising:
a first device region used for forming a first device and a second device region used for forming a second device, wherein a channel length of the first device is greater than a channel length of the second device, and the base in the first device region comprises a channel region,
preset regions located on two sides of the channel region in a length direction of the channel region and used for forming a first source/drain doping region, and a well pick-up region surrounding the channel region and the preset regions, and
a first isolation structure formed in the base between the preset regions and the well pick-up region and between the well pick-up region and the adjacent second device region;
forming discrete poly gates on the base in the first device region and the second device region, wherein the poly gate located in the first device region covers the channel region;
forming the first source/drain doping region in the preset regions on two sides of the poly gate in the first device region;
forming a second source/drain doping region in the base on two sides of the poly gate in the second device region;
forming a support structure on the first isolation structure exposed from the poly gate;
forming an interlayer dielectric layer on the base after the first source/drain doping region, the second source/drain doping region, and the support structure are formed, wherein the interlayer dielectric layer covers side walls of the poly gate and the support structure, and exposes the top of the poly gate in the second device region; and
removing the poly gate in the second device region, and forming a gate opening in the interlayer dielectric layer; and
forming a metal gate in the gate opening.

11. The method for forming a semiconductor structure according to claim 10, wherein:
the support structure comprises at least one of a first support layer or a second support layer; or
the support structure comprises a first support layer and a second support layer located on the first support layer.

12. The method for forming a semiconductor structure according to claim 11, wherein:
the support structure comprises the first support layer;
the step of forming the second source/drain doping region comprises:
forming a source/drain epitaxial layer in the base on the two sides of the poly gate in the second device region; and
performing ion doping on the source/drain epitaxial layer, to use the source/drain epitaxial layer doped with ions as the second source/drain doping region;
the step of forming the source/drain epitaxial layer comprises:
in the first device region, forming a hard mask layer on the top and side wall of the poly gate and a top surface of the base, wherein the hard mask layer exposes the poly gate in the second device region and the top surface of the base; and
forming the source/drain epitaxial layer in the base on the two sides of the poly gate exposed from the hard mask layer;
the step of forming the first support layer comprises: after the source/drain epitaxial layer is formed and before ion doping is performed on the source/drain epitaxial layer, in the first device region, removing the hard mask layer located on the top of the poly gate and top surfaces of the preset regions and the well pick-up region, and keeping the hard mask layer located on the first isolation structure for use as the first support layer; and
in the first device region, after the hard mask layer located on the top of the poly gate and the top surfaces of the preset regions and the well pick-up region is removed, forming the first source/drain doping region in the base in the preset regions.

13. The method for forming a semiconductor structure according to claim 12, wherein the method for forming a semiconductor structure further comprises:
   in the step of forming the hard mask layer, forming a first inside spacer located on the side wall of the poly gate in the second device region; and
   the step of forming the hard mask layer and the first inside spacer comprises:
      forming a hard mask material layer on the top and side wall of the poly gate and the top surface of the base; and
      removing the hard mask material layer located on the top of the poly gate in the second device region and the top surface of the base, and keeping the remaining hard mask material layer located on the side wall of the poly gate in the second device region for use as the first inside spacer.

14. The method for forming a semiconductor structure according to claim 12, wherein the method for forming a semiconductor structure further comprises:
   in the first device region, in the step of removing the hard mask layer located on the top of the poly gate and the top surfaces of the preset regions and the well pick-up region, keeping the remaining hard mask layer located on the side wall of the poly gate in the first device region for use as a second inside spacer.

15. The method for forming a semiconductor structure according to claim 12, wherein:
   in the step of providing a base, the base further comprises a functional region used for forming a functional structure; the support structure comprises the second support layer; and after the first source/drain doping region and the second source/drain doping region are formed, the second support layer is formed;
   the method for forming a semiconductor structure further comprises: in the step of forming the second support layer, forming a salicide block (SAB) layer in a partial region in the functional region; and
   after the second support layer and the SAB layer are formed, and before the interlayer dielectric layer is formed, forming a metal silicide layer in the first source/drain doping region exposed from the SAB layer, the second source/drain doping region, and a top surface of the well pick-up region.

16. The method for forming a semiconductor structure according to claim 15, wherein the step of forming the second support layer and the SAB layer comprises:
   forming a block material layer on the top and side wall of the poly gate and the top surface of the base; and
   removing the block material layer located on the top and side wall of the poly gate and top surfaces of the first source/drain doping region, the well pick-up region, and the second source/drain doping region, keeping the block material layer located on the first isolation structure for use as the second support layer, and keeping the block material layer located in the partial region of the base in the functional region for use as the SAB layer.

17. The method for forming a semiconductor structure according to claim 10, wherein:
   in the step of providing a base, a second isolation structure is further formed in the base between the channel region and the preset regions; and
   in the step of forming the poly gate, the poly gate located in the first device region covers the base of the channel region, and further extends to cover a part of the second isolation structure.

18. The method for forming a semiconductor structure according to claim 10, wherein:
   a top surface of the support structure is lower than a top surface of the poly gate in the second device region, or
   a top surface of the support structure is level with a top surface of the poly gate in the second device region.

19. The method for forming a semiconductor structure according to claim 18, wherein in a surface normal direction of the base, a height difference between the top surface of the support structure and the top surface of the poly gate in the second device region is 100 Å to 500 Å.

20. The method for forming a semiconductor structure according to claim 10, wherein in a width direction of the first isolation structure, the side wall of the support structure is indented relative to a side wall on the same side of the first isolation structure.

* * * * *